(12) United States Patent
Sivaramakrishnan et al.

(10) Patent No.: US 11,041,253 B2
(45) Date of Patent: Jun. 22, 2021

(54) SILICON WAFERS BY EPITAXIAL DEPOSITION

(71) Applicant: Svagos Technik, Inc., Santa Clara, CA (US)

(72) Inventors: Visweswaren Sivaramakrishnan, Cupertino, CA (US); Tirunelveli S. Ravi, Saratoga, CA (US); Andrzej Kaszuba, San Jose, CA (US); Quoc Vinh Truong, San Leandro, CA (US); Jean R. Vatus, San Jose, CA (US)

(73) Assignee: Svagos Technik, Inc., Santa Clara, CA (US)

( * ) Notice: Subject to any disclaimer, the term of this patent is extended or adjusted under 35 U.S.C. 154(b) by 0 days.

(21) Appl. No.: 15/991,785

(22) Filed: May 29, 2018

(65) Prior Publication Data

US 2019/0003076 A1 Jan. 3, 2019

Related U.S. Application Data

(63) Continuation of application No. 15/014,404, filed on Feb. 3, 2016, now Pat. No. 9,982,363, which is a
(Continued)

(51) Int. Cl.
*C30B 21/02* (2006.01)
*C30B 25/14* (2006.01)
(Continued)

(52) U.S. Cl.
CPC ............ *C30B 25/14* (2013.01); *C30B 25/105* (2013.01); *C30B 25/12* (2013.01); *C30B 25/165* (2013.01);
(Continued)

(58) Field of Classification Search
CPC ................... C30B 29/04; C30B 21/02
See application file for complete search history.

(56) References Cited

U.S. PATENT DOCUMENTS

| 3,576,679 A | 4/1971 | Shipps |
| 5,201,996 A | 4/1993 | Gmitter et al. |

(Continued)

OTHER PUBLICATIONS

Riepe et al "Silicon Material Technology and Evaluation Center (SIMTEC) At Fraunhoffer ISE Achievenments and Visions" presented at the 23rd European Photovoltaic Solar Energy Conference and Exhibition 1. 5. Sep. 2008 Valencia Spain 6 pages.*

(Continued)

*Primary Examiner* — Robert M Kunemund
(74) *Attorney, Agent, or Firm* — Pillsbury Winthrop Shaw Pittman LLP

(57) ABSTRACT

A system for depositing thin single crystal silicon wafers by epitaxial deposition in a silicon precursor depletion mode with cross-flow deposition may include: a substrate carrier with low total heat capacity, high emissivity and small volume; a lamp module with rapid heat-up, efficient heat production, and spatial control over heating; and a manifold designed for cross-flow processing. Furthermore, the substrate carrier may include heat reflectors to control heat loss from the edges of the carrier and/or heat chokes to thermally isolate the carrier from the manifolds, allowing independent temperature control of the manifolds. The carrier and substrates may be configured for deposition on both sides of the substrates—the substrates having release layers on both sides and the carriers being configured to have equal process gas flow over both surfaces of the substrate. High volume may be addressed by a deposition system comprising multiple mini-batch reactors.

17 Claims, 27 Drawing Sheets

Section Y'-Y'

Related U.S. Application Data continuation of application No. 13/483,002, filed on May 29, 2012, now Pat. No. 9,255,346.

(60) Provisional application No. 61/491,152, filed on May 27, 2011.

(51) Int. Cl.
| | |
|---|---|
| *C30B 25/16* | (2006.01) |
| *C30B 29/06* | (2006.01) |
| *C30B 25/10* | (2006.01) |
| *C30B 25/12* | (2006.01) |
| *C30B 25/20* | (2006.01) |
| *H01L 21/02* | (2006.01) |
| *H01L 31/18* | (2006.01) |

(52) U.S. Cl.
CPC .............. *C30B 25/20* (2013.01); *C30B 29/06* (2013.01); *H01L 21/0245* (2013.01); *H01L 21/0262* (2013.01); *H01L 21/02381* (2013.01); *H01L 21/02513* (2013.01); *H01L 21/02532* (2013.01); *H01L 31/1804* (2013.01)

(56) References Cited

U.S. PATENT DOCUMENTS

| | | |
|---|---|---|
| 2003/0056720 A1 | 3/2003 | Dauelsberg et al. |
| 2010/0263587 A1 | 10/2010 | Sivaramakrishnan et al. |

OTHER PUBLICATIONS

China National Intellectual Property Administration, Office Action for CN Patent Application 201610926004.1, dated Dec. 14, 2018, pp. 1-12.

\* cited by examiner

Section X-X

Section Y'-Y'

Section Y'-Y'

Section Y'-Y'

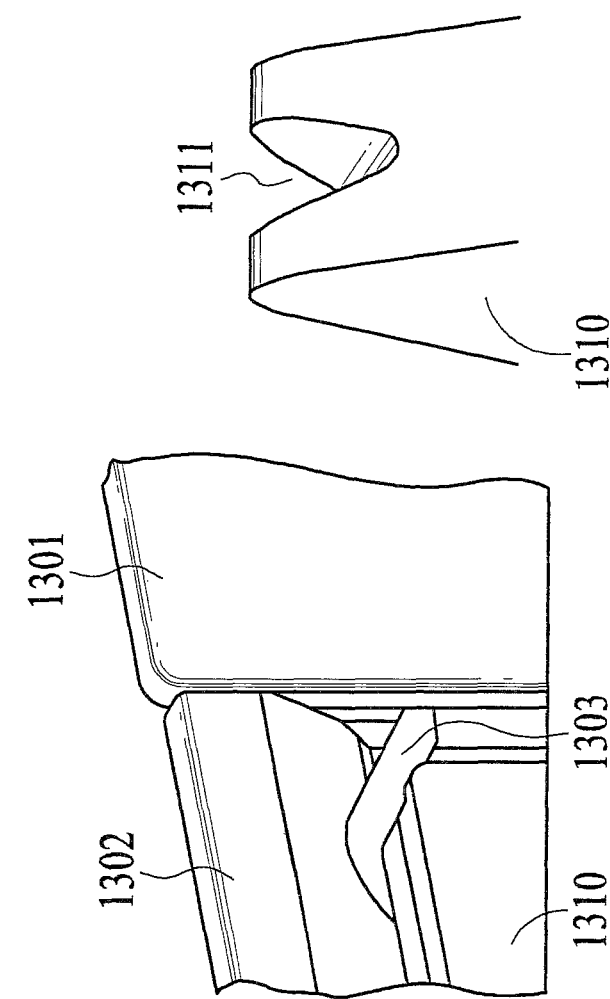
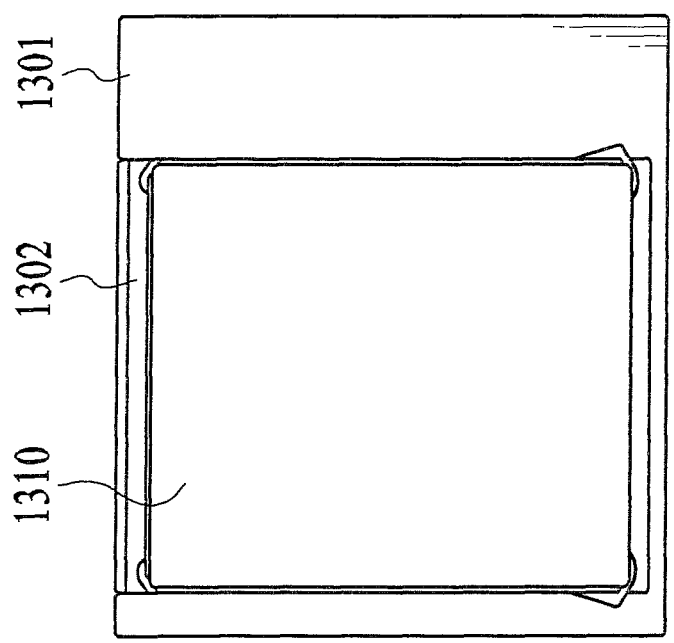
FIG. 13C
FIG. 13B
FIG. 13A

Section Y"-Y"

Section Z"-Z"

Section X"-X"

SILICON WAFERS BY EPITAXIAL DEPOSITION

CROSS-REFERENCE TO RELATED APPLICATIONS

This application is a continuation of U.S. patent application Ser. No. 15/014,404 Filed Feb. 3, 2016, which is a continuation of U.S. patent application Ser. No. 13/483,002 filed May 29, 2012, which claims the benefit of U.S. Provisional Application No. 61/491,152 filed May 27, 2011, all applications incorporated herein by reference in their entirety.

FIELD OF THE INVENTION

The present invention relates generally to fabrication of silicon wafers, and more particularly to fabrication of silicon wafers by epitaxial deposition.

BACKGROUND

Crystalline silicon provides high solar cell efficiencies, $\eta$, of up to approximately 23% in commercial production environments, together with advantages, when compared with thin film solar cells such as CIGS, CdTe, etc., of (a) availability, (b) environmentally friendliness, and (c) demonstrated long lifetimes and associated technology maturity. However, crystalline silicon traditionally has a higher photovoltaic module cost than competitive thin-film panels. (A module is the unit that actually generates power and includes a frame holding a number of solar cells, the latter being electrically connected together in series and then to an inverter.) A large part of this cost comes from the cost of manufacturing the silicon wafers (currently ~180 µm thick), which includes the cost of polysilicon production, ingot formation, and wafering (wire sawing the ingot and finishing the cut wafers).

Thin film processes (amorphous silicon, CIGS and CdTe) have in recent years evoked excitement because of potentially lower costs than crystalline silicon due to less consumables and large-format, integrated processing. However, in general thin film photovoltaic (PV) modules typically have efficiencies substantially less than that of crystalline silicon modules. A typical mono-crystalline module has an efficiency of 15-16% (with some modules as high as 20%), whereas the best case for thin film modules is currently 11%. In addition, the cost advantages of most thin film processes have not been conclusively demonstrated. As a result, crystalline silicon (both monocrystalline and multicrystalline) commands more than an 80% share of the current PV market, at approximately 14 GW for 2010. (Quantities of PV modules are commonly measured by their total power output in Watts.)

A total installed cost for PV modules of less than $2.50/Wp (Wp is Watt peak, referring to the maximum achievable power) is attractive today since in many parts of the world it represents grid-parity with modest incentives. (Grid parity refers to the cost per Watt from a PV module being the same as the cost per Watt available over an electricity distribution grid, where a typical grid I fed by a multitude of power sources such as coal, oil and gas power stations.

Manufacturers have been particularly effective at reducing the manufacturing costs of conventional crystalline silicon (both monocrystalline and multicrystalline) technologies—silicon PV modules have come down in price from more than $4 per Wp in 2006 to roughly $1.80 per Wp in 2010. The most cost efficient integrated manufacturers of PV wafers, cells and modules currently have costs of goods sold (cost of making PV module, including material, labor and overheads) for a PV module approaching $1.10 per Wp. These cost reductions over the past four years have in part been due to the following technical improvements.

First, silicon usage has been reduced from 10 gms per Watt to roughly 6.5 gms per Watt due to a reduction in the solar cell thicknesses and improved wafer sawing processes with lower kerf losses.

Second, cell efficiencies have been improved by fine line printing, improved front-side reflection and passivation control, higher quality (higher lifetime) materials, etc. The average silicon cell efficiency has increased from approximately 14% to 17%, with a number of manufacturers reporting 18% cell efficiencies for their monocrystalline silicon PV cells.

Third, manufacturing has been more fully integrated—there has been a trend to concatenate the various parts of the silicon PV module manufacturing process (polysilicon, wafer, cell, and module) for greater cost-effectiveness, and there is now world wide access to system integrators and installers. For example, in 2010 integrated manufacturing resulted in a cost structure that gives a COGS for PV modules of approximately $1.10.

It is clear that, for the foreseeable future, single crystal silicon PV modules can continue to be a leader in PV and will compete effectively with thin film PV technologies as grid parity is reached, providing single crystal silicon PV module manufacturing can continue with further cost reductions. However, the source of further cost reductions is not immediately apparent.

PV cell and module costs are approaching asymptotic levels with the deployment of large scale production equipment and single crystal silicon cell efficiencies near 19% have been reached, and further increases in cell efficiency may only be achieved at increased cost.

However, further cost reductions may come from a significant reduction in silicon and wafering costs since they now represent the largest portion of the module cost structure. Silicon and wafering costs would be reduced by (a) further reductions in polysilicon production costs, (b) improvements in the crystal growth processes and/or (c) sawing wafers thinner with high yield and low kerf loss. Similarly, a continuous Czochralski crystal growth process may provide incremental cost improvements, but radical cost reductions are unlikely. However, sawing wafers to less than 180 µm has been plagued by lower yields and disproportionately higher kerf losses, as the wire saw technology starts to reach fundamental mechanical limits Hence, reduction of silicon usage requires looking at new technologies that can bypass the polysilicon, ingoting, and wafering steps altogether.

A further incentive for bypassing these steps is that polysilicon is currently the step that gates the expansion of silicon PV module production capacity, primarily due to the capital cost associated with the polysilicon step alone. In fact, the capital costs—the one-time set-up costs for manufacturing—for polysilicon, ingoting and wafering dominate the total capital costs for production of silicon PV devices. Not only do polysilicon, ingoting and wafering have the highest capital cost (accounting for approximately $2 per Wp out of a total of $3 per Wp for setting up for production of solar cell modules), they also require the most infrastructure in terms of land, gases, water, etc.

It is evident from the above discussion that the crystalline silicon PV industry has made great strides in reducing cost and remaining competitive with thin film PV. However, to get to unsubsidized grid parity at roughly $0.08 per kWh (which is equivalent to approximately $2 per Wp), the total COGS needs to be reduced to approximately $0.80 per Wp for crystalline silicon PV wafers, which is what is required to get to system installed costs for crystalline silicon PV modules of $2 per Wp. This reduction is difficult for conventional silicon PV technology—a technology that has already benefitted from the cost reductions due to mass production and innovations that originate in the conventional silicon semiconductor industry. Hence, it is evident that there is a need for cheaper new processes that can replace the current costly processes associated with polysilicon, ingoting and wafering, along with an attendant decrease in capital costs.

Epitaxial deposition of crystalline silicon substrates for PV module production allows a drastic simplification of the supply chain—eliminating the need for polysilicon, ingoting and wafering. However, the challenge is utilizing an epitaxial deposition process at a cost which is comparable if not lower than traditional processes for manufacturing the single crystal silicon wafers.

Epitaxial deposition of thin films of silicon is a common process step in the fabrication of semiconductor devices such as integrated circuits. To enable a high yield for the integrated circuits, this epitaxial deposition step requires that the deposited silicon is of very high quality with a very stringent thickness uniformity. This can only be achieved at lower deposition rates and therefore most of the semiconductor epitaxial reactors are optimized for highly uniform, low defect deposition rates of 0.1 to 1 μm per min. Today almost all advanced high performance CMOS (complementary metal oxide semiconductor) devices are built on such epitaxial layers.

Most conventional epitaxial batch reactors used in the semiconductor industry depend on diffusion to supply reactants—such as trichlorosilane (TCS) and hydrogen—to the center of wafers which inherently results in a higher concentration of TCS on the wafer edge since the gas flow is typically along the periphery of the wafer stack. Thus in order to maintain within wafer and wafer-to-wafer film thickness uniformity, such reactors have to be run in a reaction-rate limited regime at lower temperatures where deposition rates are much lower. Furthermore, for deposition of thin epitaxial films where film quality and uniformity is very important and the device value can accommodate the high process cost, high temperature epitaxial growth is utilized, typically in a single wafer reactor. In this high temperature process chemical vapor deposition (CVD) of TCS is done under a mass transport limited regime where the growth is dependent on the mass transport of TCS to the reaction surface across a boundary layer. However, high temperature processing of single wafers is cost prohibitive for all except the very high value devices such as cutting edge processors.

To circumvent limitations of reactors which rely on diffusion of reactants, some semiconductor epitaxial reactors are designed to have a constant growth rate across the surface of the wafer by forming a stable boundary layer across which there is a constant availability of precursor species. This is typically achieved using the following techniques.

First, the wafer is rotated, which ensures that the gas velocity and the boundary layers are constant across the wafer surface. However, having to rotate the wafers limits reactor types to either single wafer reactors or small batch reactors.

Second, a sufficient supply of TCS is provided such that the TCS is available in the vicinity of the reactant surface without incurring precursor depletion. This can be achieved by having multiple precursor gas injection points to flood the deposition chamber with TCS. Consequently, in these reactors the TCS utilization is typically only around 5%.

Third, the temperature of the wafers is typically less than 1050° C., thus the growth rates are less than 1 μm per min Although higher growth rates can be achieved in these reactors, design constraints due to the requirement for wafer rotation at deposition temperatures generally keeps the operating temperature in the 1,000 to 1,050° C. range. For semiconductors this low deposition rate is acceptable since the thickness uniformity and epitaxial quality in-terms of low defect density are paramount.

Fourth, the substrates must be heated-up to deposition temperature and then cooled-down after deposition is complete—this typically takes one hour and is on top of the deposition time for throughput calculations if done in the deposition chamber. Note that these deposition systems typically utilize inductive heating systems, rated at roughly 200 kW.

FIG. 1 (from Sandra Bau, High-temperature CVD silicon films for crystalline silicon thin-film solar cells, Ph.D. dissertation, University of Konstanz 2003 (see page 18, FIG. 3.4), available at http://kops.ub.uni-konstanz.de/handle/urn:nbn:de:bsz:352-opus-11305) shows a plot of growth rate of silicon from TCS as a function of key variables—the substrate temperature and the TCS to $H_2$ ratio. In the case of semiconductor applications, for which commercial epitaxial reactors have been designed, the growth rate must be controlled with a high degree of accuracy, which requires operation of the process under conditions where fluctuations in temperature and TCS to $H_2$ ratio result in no appreciable change in the deposition rate. Thus, the operating region for commercial semiconductor epitaxy is on the flat part of the curve as indicated in FIG. 1.

The following assumptions are used to estimate the cost of epitaxial deposition of a 180 μm crystalline silicon wafer on a 125 mm substrate, assuming production in a commercial semiconductor epitaxial reactor with an 8 wafer batch capacity. At a 1 μm per minute deposition rate (see FIG. 1), and including heat-up and cool-down time of 60 minutes, the total production time is 240 minutes. The throughput of a single system operating with an 8 wafer batch is $$8 \times 60/240 = 2 \text{ wafers per hour.}$$

The depreciation cost per wafer over a 7 year period and assuming a 90% up-time, a 90% utilization and a $1.2M ASP (application specific product) for the reactor is given by $$\$1.2M/(2 \times 0.9 \times 0.9 \times 24 \times 350 \times 7) = \$12.60 \text{ per wafer.}$$

The TCS consumed per wafer, at 5% utilization is 650 grams per wafer. Assuming the commercial price of TCS is $3 per kg, the cost of TCS per wafer is $2 per wafer. The total power used to produce a batch of 8 wafers is estimated to be 200 kW, and with a cost of power per wafer of 40 per kWh, this gives a cost of power of $1 per wafer. Other gases and consumables are estimated to be approximately $1 per wafer. Consequently, the total cost of epitaxial deposition is estimated to be $16.6 per wafer.

Using epitaxial deposition for producing crystalline silicon wafers for PV modules is attractive since it would allow a drastic simplification of the supply chain, although the cost of the epitaxial deposition must be comparable if not lower than traditional processes for manufacturing the silicon wafers. As described above, the cost of silicon wafers for PV applications needs to be close to $0.80 per wafer. However, using commercial semiconductor epitaxial reactors it is estimated to cost substantially more than this—roughly $16.6 per wafer. Clearly, there is a need for an epitaxial deposition reactor that will bring the cost per wafer down by roughly a factor of 25 or more.

SUMMARY OF THE INVENTION

The present invention as described herein is a transformative technology for the reduction of manufacturing costs of single crystal silicon photo-voltaics based on the method involving direct-epitaxial deposition of the silicon wafers. Monocrystalline silicon wafers are produced directly from the gas phase, using technology that bypasses the steps of (a) polysilicon production, (b) crystal growth, and (c) wafering of the ingots. This enables a substantial reduction in silicon usage and production cost with a potential for manufacturing costs approaching grid parity for high efficiency PV modules. Key innovations in process and equipment technologies, which alone or in combination, enable stringent cost and technology targets, as well as scalability into volume production, include: epitaxial deposition in a silicon precursor depletion mode with cross-flow deposition to compensate for the decrease in silicon deposition rate on substrates along the direction of gas flow; a deposition system comprising multiple mini-batch reactors; a substrate carrier with low total heat capacity, high emissivity and small volume; a lamp module with rapid heat-up, efficient heat production, and spatial control over heating; and a manifold designed for cross-flow processing. Furthermore, the substrate carrier may include heat reflectors to control heat loss from the edges of the carrier and/or heat chokes to thermally isolate the carrier from the manifolds, allowing independent temperature control of the manifolds. The carrier and substrates may be configured for deposition on both sides of the substrates—the substrates having release layers on both sides and the carriers configured to have equal process gas flow over both surfaces of the substrate. Furthermore, the deposition system may be configured to allow removal of substrate carriers from the reactor while the substrate carrier is still at 400 to 600° C., thus reducing process cycle time through the reactor. Furthermore, the substrate carrier may be configured to engage with the gas manifold in the reaction chamber of the reactor to contain process gases within the substrate carrier, thus enabling a low frequency of cleaning for the reaction chamber of the reactor and a high reactor availability.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 13A, B & C provide detailed perspective views of a second embodiment of a substrate carrier, according to the present invention;

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention may represent a transformational technology for the production of silicon wafers using epitaxy—the CVD deposition of single crystal silicon from the gas phase provided the cost of the epitaxial deposition is comparable if not lower than the current conventional processes for silicon wafer production for PV. Using epitaxial deposition, the three most cost-intensive steps are eliminated from conventional silicon PV technology—polysilicon production, the growth of ingots and the machining and wafering of the ingots. The process of the present invention, replacing the three most cost intensive steps, addresses the fundamental cost drivers of silicon PV—that of excessive materials usage and complexity of material production, as well as high capital costs at the front end associated with polysilicon, ingoting, and wafering. The approach of directly depositing the silicon provides an alternative to the cost intensive conventional silicon wafer production technologies while keeping the high efficiency associated with monocrystalline silicon PV.

Figure 2:
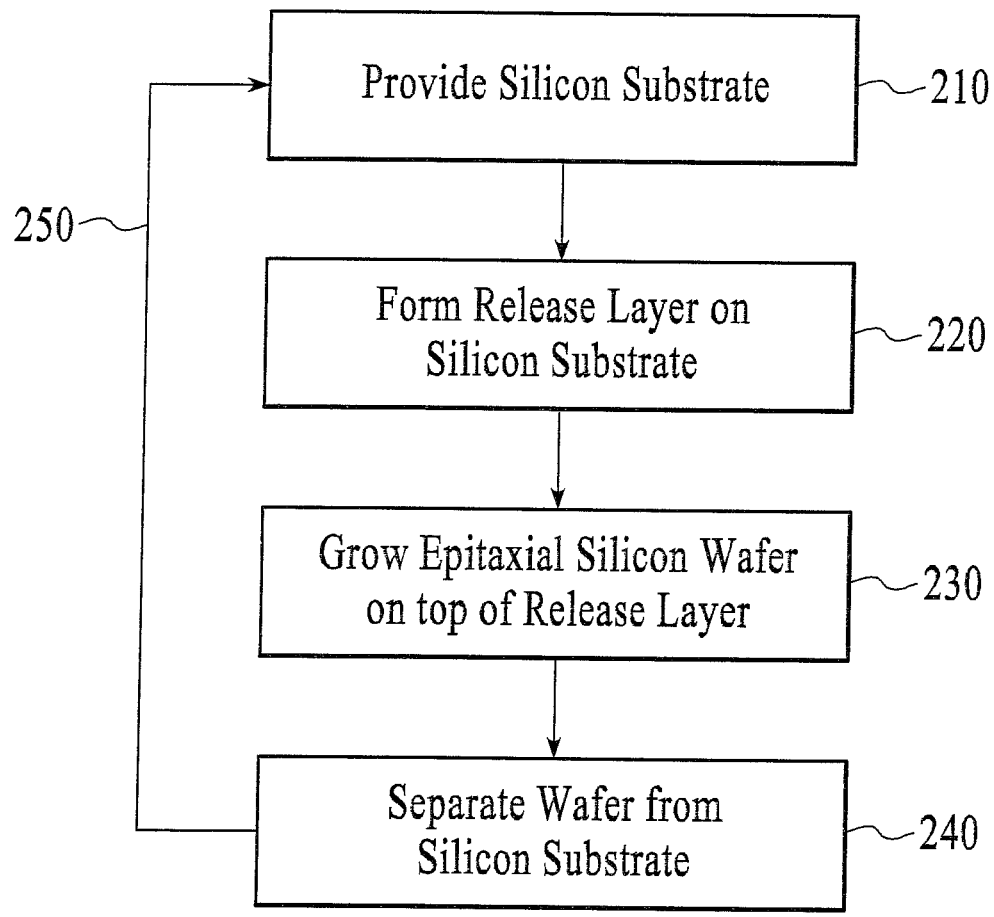
FIG. 2 is a process flow for epitaxial silicon substrate growth, according to embodiments of the present invention.
Figure 21:
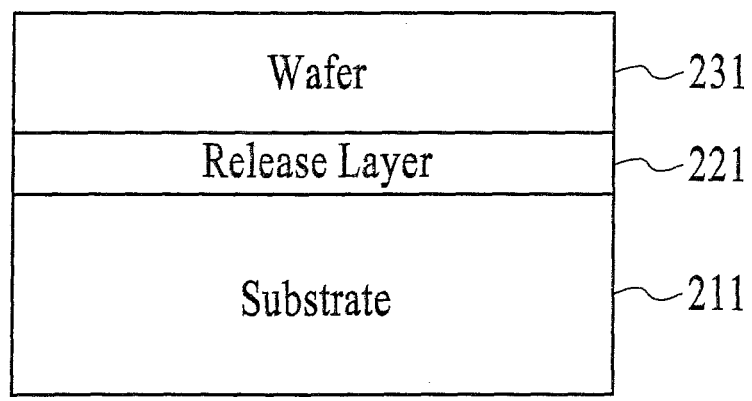
FIG. 21 is a cross-sectional representation of a wafer grown on a release layer over a substrate, according to embodiments of the present invention.

A process flow diagram for the epitaxial deposition of silicon wafers is provided as FIG. 2. The process includes: providing a silicon substrate (210); forming a release layer on the silicon substrate (220); growing an epitaxial silicon wafer on top of the release layer (230); separating the wafer from the silicon substrate (240); and reusing the substrate, after cleaning the substrate to remove any remaining release layer (250). A cross-sectional representation of a wafer 231 grown on a release layer 221 over a substrate 211 is shown in FIG. 21. Epitaxial techniques, followed by separation processes, have been described in the literature as a method to obtain ultra-thin (~5-50 μm) crystalline solar cells. For example, see Brendel et al. "15.4%-efficient and 25 μm-thin crystalline Si solar cell from layer transfer using porous silicon" Phys. Stat. Sol. (a) 197, No. 2, 497-501 (2003). These methods allow for dramatic reductions in Si usage (by approximately 80% compared to utilizing current commercially available thin Si wafers made by the conventional polysilicon, ingoting and wafering process), while maintaining high cell efficiencies with appropriate light trapping and surface passivation. However, these processes are not cost competitive with conventional wafer production. The challenge is to provide an epitaxial deposition process at a sufficiently low cost to be able to benefit from the reduction in silicon usage. The present invention may provide such a low cost epitaxial deposition tool and process and a drastic simplification of the supply chain.

Requirements Of Epitaxially Deposited Silicon Wafers For Photovoltaic Applications In order to provide a technical specification for an epitaxial reactor for the production of silicon wafers for PV devices it is helpful to understand the specific physical requirements of the silicon wafers, which are different from wafers fabricated for semiconductor device manufacture.

First consider defect density—this is not a major consideration as long as the defects do not result in reduced minority carrier lifetime or reduce the strength of the wafer. A defect density of $1 \times 10^5$ per $cm^2$ is acceptable since it still results in acceptable minority carrier lifetimes (greater than 10 μs), and mechanical strength sufficient to allow processing into cells and modules. In semiconductor applications the defect density requirement is to be less than 1 per $cm^2$ mainly due to the small minimum features which are defined lithographically. The defect density requirement limits the growth rate since the defect density increases with growth rate and growth rates above approximately 1 micron per minute have defect densities above specification. The relaxation of this requirement for solar applications means that a growth rate for epitaxial layers of well over 4 μm per minute can be used. This higher growth rate is attainable in embodiments of the epitaxial reactors of the present invention.

Second consider thickness uniformity—in semiconductor epitaxy, the requirement for thickness uniformity across the wafer is less than 2% (driven by stringent depth-of-field restrictions in lithography), whereas for solar approximately +/−10% variation in thickness is acceptable. This relaxed thickness uniformity requirement is attainable in some embodiments of the epitaxial reactors of the present invention which can be operated in silicon precursor gas depletion mode—TCS utilization has been shown to exceed 50% when the reactor is operated in depletion mode.

Figure 1:
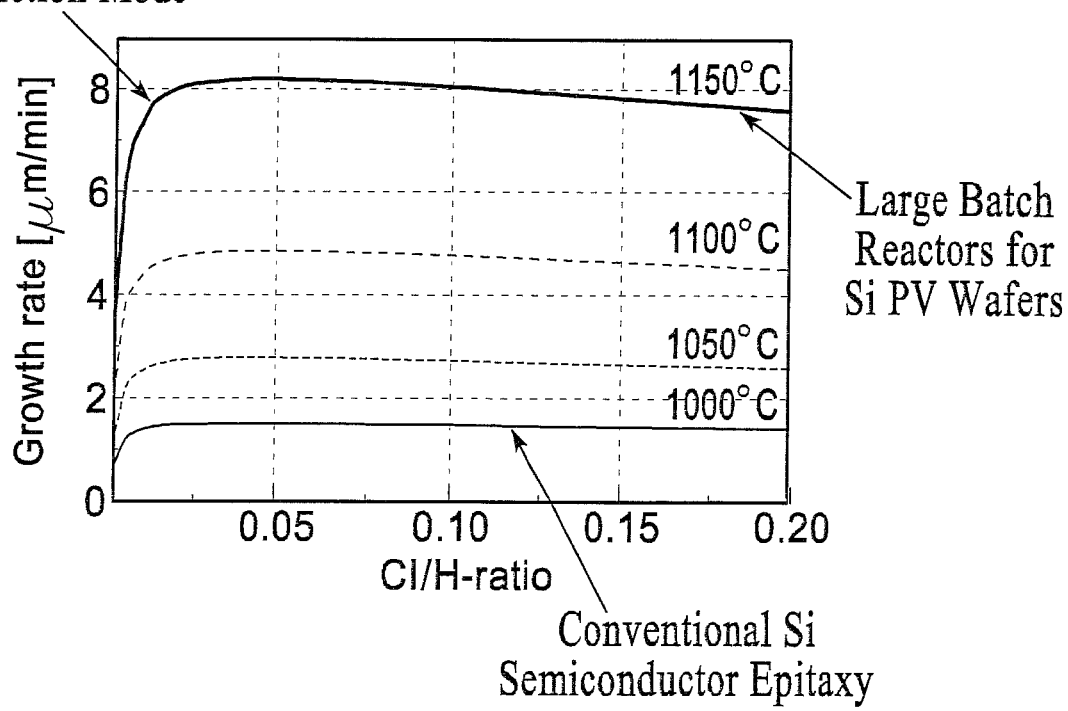
FIG. 1 is a plot of deposition rate of epitaxial silicon as a function of Cl/H ratio in the deposition gas calculated for a horizontal atmospheric pressure epitaxial reactor.

Furthermore, to reduce manufacturing costs of the silicon wafers, high output silicon wafer fabrication systems are needed. Approaches to increase the throughput of wafers in an epitaxial deposition system have involved very large batches of wafers all being heated and deposited with silicon at the same time. The main issue with this approach is that the volume of such chambers is large and requires long heat-up and cool-down times. Thus to get 200 wafers per hour, for example, the batch size needs to be over 600 wafers to take into account the heating and cool-down times. This makes the design very complex and so far such designs have not been proven practical. Furthermore, as shown in FIG. 1, these large batch reactors are forced by design to run in the regime where there is very little TCS depletion and therefore low TCS utilization. (TCS depletion becomes more and more difficult to compensate for as the path length of the precursor gases through the wafer carrier increases, such that for very large batch reactors operation in a depletion mode is impractical.)

An epitaxial reactor of the present invention takes advantage of the more relaxed defect density and thickness uniformity requirements when compared with the requirements of epitaxial silicon in the semiconductor industry. One embodiment of the epitaxial reactor of the present invention has the following requirements: (1) a throughput of greater than approximately 200 wafers per hour; (2) silicon deposition rates greater than 3.5 μm per minute, compared with 1 μm per minute for semiconductor device applications; (3) thickness uniformity better than approximately +/−10% (compared with +/−1% for semiconductor device applications); (4) efficient power utilization—power utilization comparable to an equivalent throughput conventional Siemens reactor, which is only roughly 50% of the energy requirement for the conventional process which also includes a large energy budget for crushing, melting, etc of the silicon; and (5) efficient TCS utilization of roughly 50% (compared with 5% for semiconductor device applications). The key innovations that enable the above requirements are described below.

High Throughput Mini-batch Reactor

Figure 3:
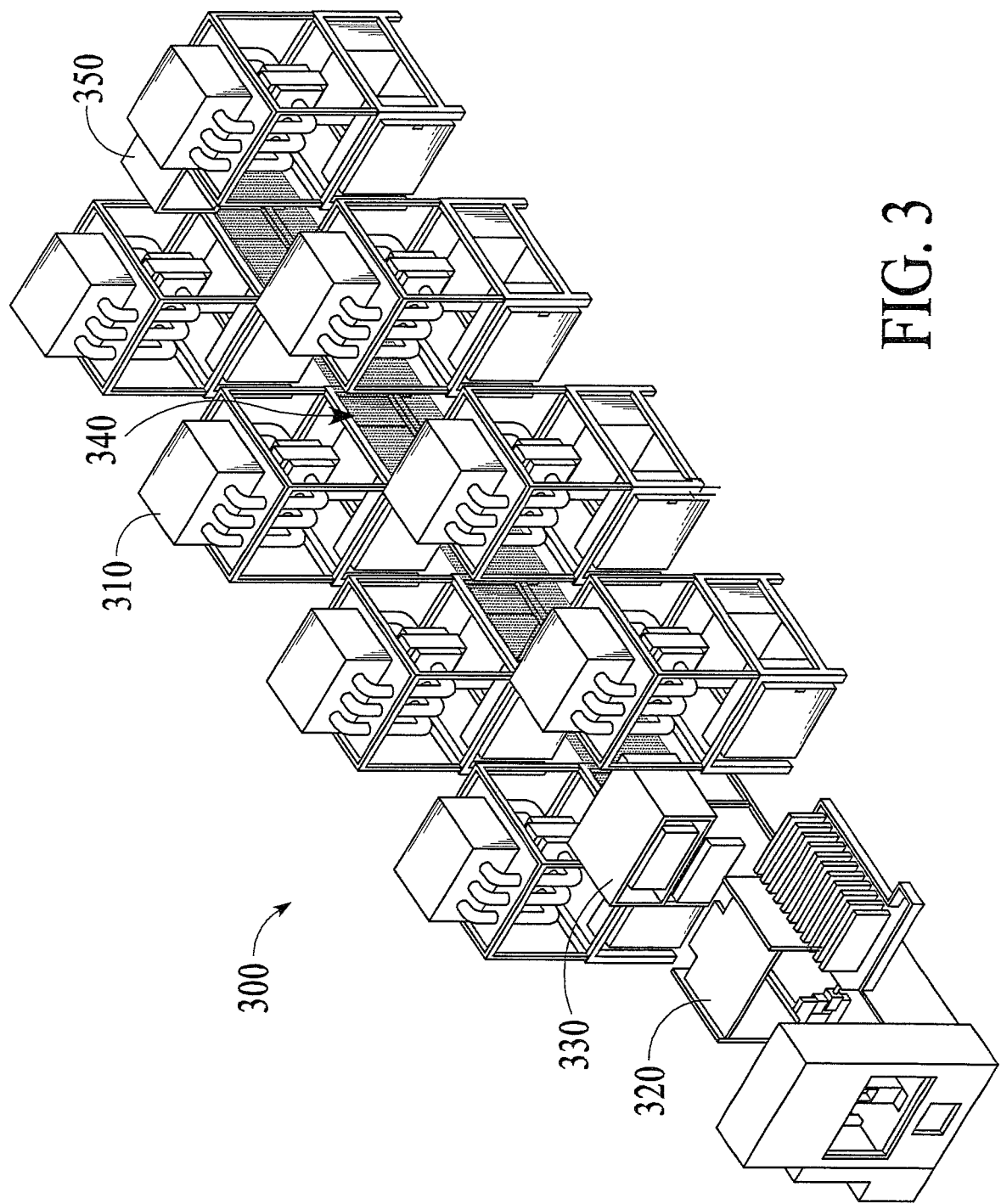
FIG. 3 is a perspective view of a system of mini-batch epitaxial reactors configured for high throughput processing, according to embodiments of the present invention.

In embodiments of the present invention throughput is increased using a mini-batch concept with multiple mini-batch reactors to a system. Multiple mini-batch reactors have advantages over a single large reactor since control of substrate temperature and gas flow over the surface of the substrates is more readily achieved in a small reactor. Furthermore, multiple mini-batch reactors are more desirable as far as maintenance is concerned, since it is easier to keep a continuous high throughput while dealing with both scheduled and unscheduled maintenance. FIG. 3 illustrates an example of a silicon wafer epitaxial deposition system 300 based on multiple mini-batch reactors 310. Multiple substrates are loaded into substrate carriers at loading station 320 and then transferred to a pre-heat chamber 330 where the substrates and carrier are heated up to 400° C. The carrier is transported by a transport device through tunnel 340 and inserted into one of the mini-reactors 310. (Alternatively, the carrier loaded with substrates may be placed directly into the reactor at room temperature and heated up to deposition temperatures entirely within the reactor.) The carrier is then heated to approximately 1,150° C. and the silicon wafers are epitaxially deposited on the substrates. After the silicon deposition process is complete, the substrate carrier is cooled to approximately 400 to 600° C. and then the carrier is removed from the mini-reactor 310, transported through tunnel 340 (for which the sides, top and transport robot are not shown) and placed in a cool-down chamber 350 for cooling to room temperature before being removed from the system 300. In the meantime a carrier with unprocessed substrates is loaded into the epitaxial reactor thus ensuring continuous operation. Removal of substrate carriers from the mini-reactor while the substrate carrier is still at 400 to 600° C., thus reducing process cycle time through the reactor. The tunnel may be filled with nitrogen gas (less than 1% oxygen) or an over-pressure of nitrogen may be used in the reactor when the substrate carriers are inserted and removed, in order to keep undesirable gases out of the reactor. Furthermore, if it is desired to minimize oxidation of the deposited silicon a nitrogen ambient may be used in the tunnel. Note that movement of the hot substrate carrier may be implemented by a robot with carrier arms with low thermal conductivity, low total heat capacity and low weight; this carrier arm both protects the robot from the heat of the substrate carrier and more importantly avoids too rapid a cooling of the substrate carrier.

FIG. 3 is a particular example of a system which has 8 mini-batch reactors. However, these systems may have anywhere between 4 and 10 mini-batch reactors—primarily limited by the transport device. Furthermore, other transport devices may accommodate a different and/or wider range of mini-batch reactors per system.

Note that the mini-batch approach allows for use of depletion mode deposition by keeping the path length of precursor gases through the wafer carrier across the surface of the silicon substrates short enough to be controlled such that the deposition thickness uniformity requirements can be met. For example, FIGS. 7 and 8 below show a path length for precursor gases across the silicon substrates of only two substrate widths, for which sufficiently uniform deposition thickness with high TCS utilization (>50%) has been experimentally confirmed—see FIGS. 11A & 11B.

Further to the mini-batch reactor system described above with reference to FIG. 3, those skilled in the art will appreciate that there are many variations of the system that fall within the scope of the present invention. For example, the system may be configured without a tunnel and include a larger number of reactors aligned to be serviced by a robot with a long linear travel. Furthermore, the reactors may be configured for pass-through processing—substrate holders are loaded through a gate valve on one side of the reactor and are removed through a gate valve on an opposite side. The latter configuration would require at least two robots—one for loading and one for unloading. Yet furthermore, when lower system throughput can be tolerated, the reactors may be clustered around a single robot—this has the advantage of a smaller chamber for the robot in which the environment may be readily controlled should oxidation of deposited layers need to be minimized.

Epitaxial Reactor

Figure 4:
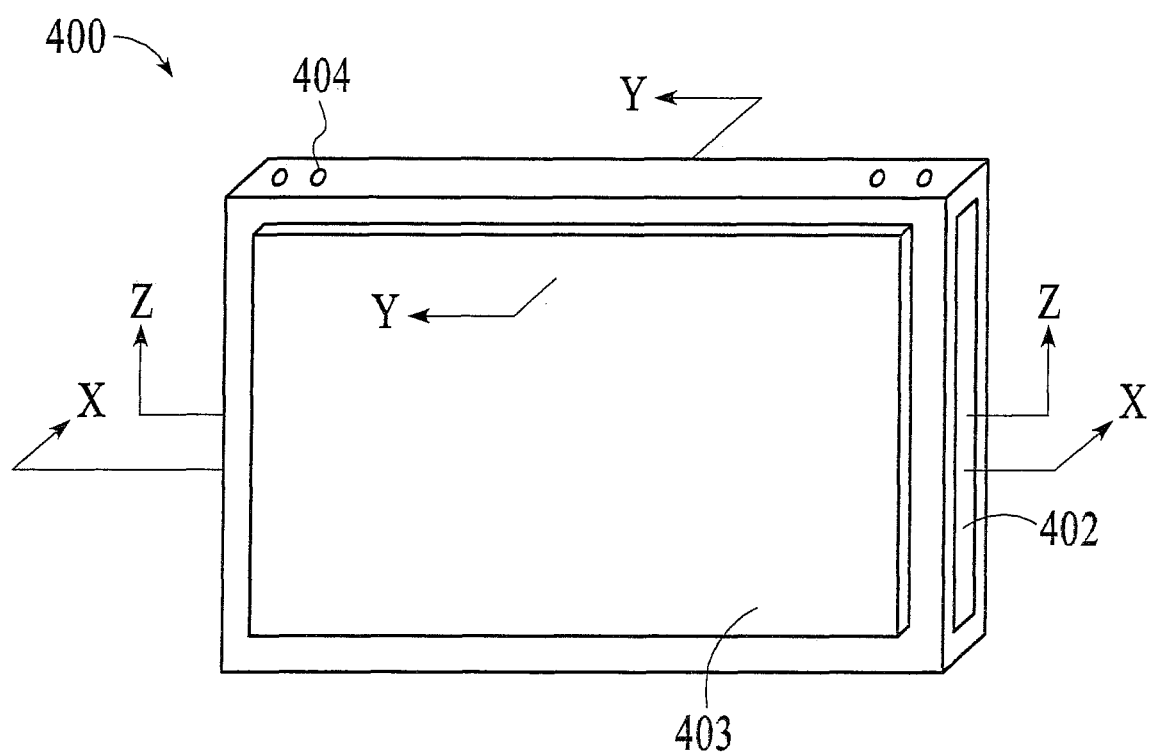
FIG. 4 is a perspective view of an epitaxial reactor, according to embodiments of the present invention.

FIG. 4 shows a process chamber 400 for one of the reactors 310. The process chamber 400 comprises a vessel 401 made of stainless steel or other suitable material, a gate valve 402 for inserting and removing a substrate carrier, lamp modules 403 for providing rapid, spatially controllable heating of the substrate carrier and various apertures 404 for providing and removing gases, coolants, etc. As will be clear to those skilled in the art, many details such as electrical connectors, mechanical adjustment devices, etc. are not shown for the sake of clear illustration of features of the invention.

Figure 5A:
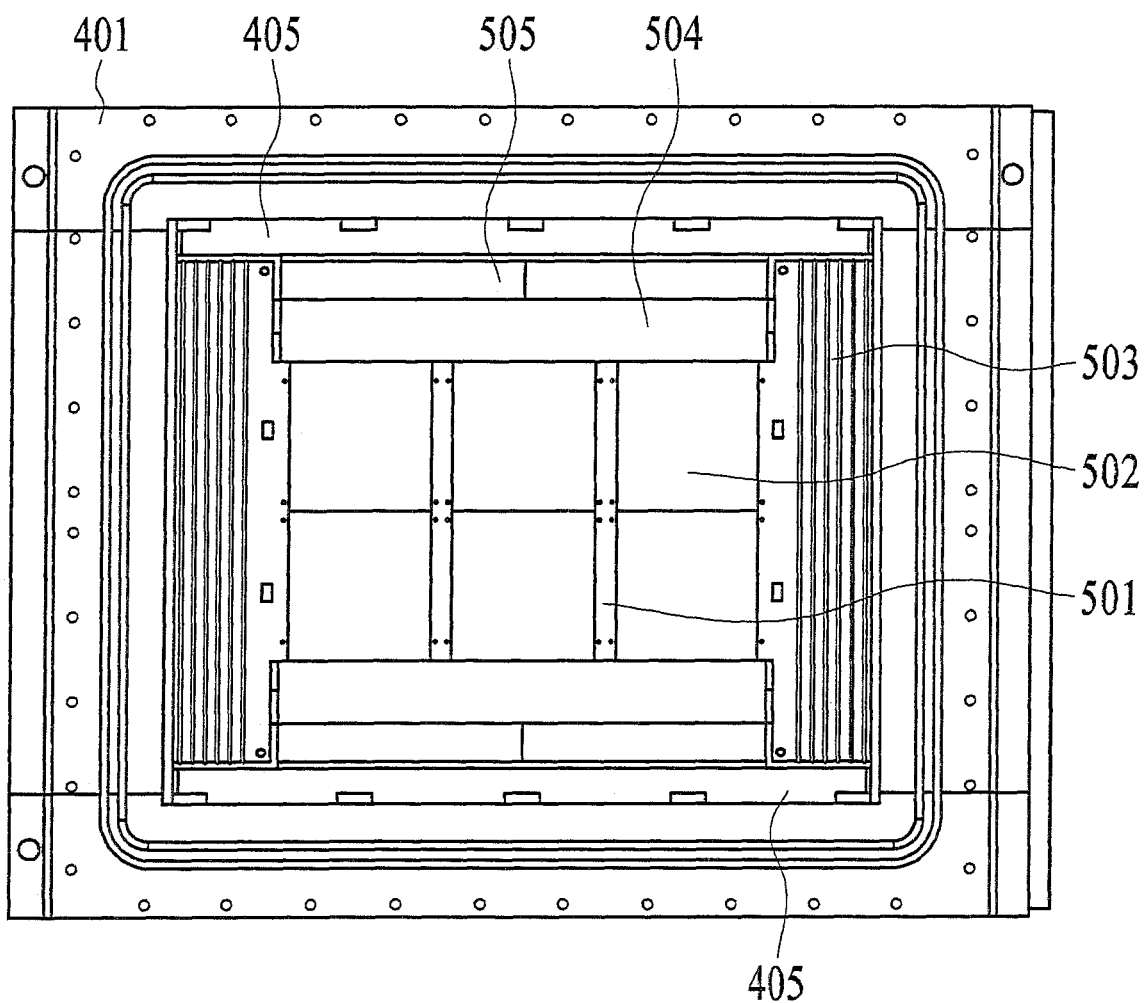
FIG. 5A is a partial cutaway view along X-X of the epitaxial reactor of FIG. 4, the reaction chamber containing a substrate carrier, according to embodiments of the present invention.
Figure 5B:
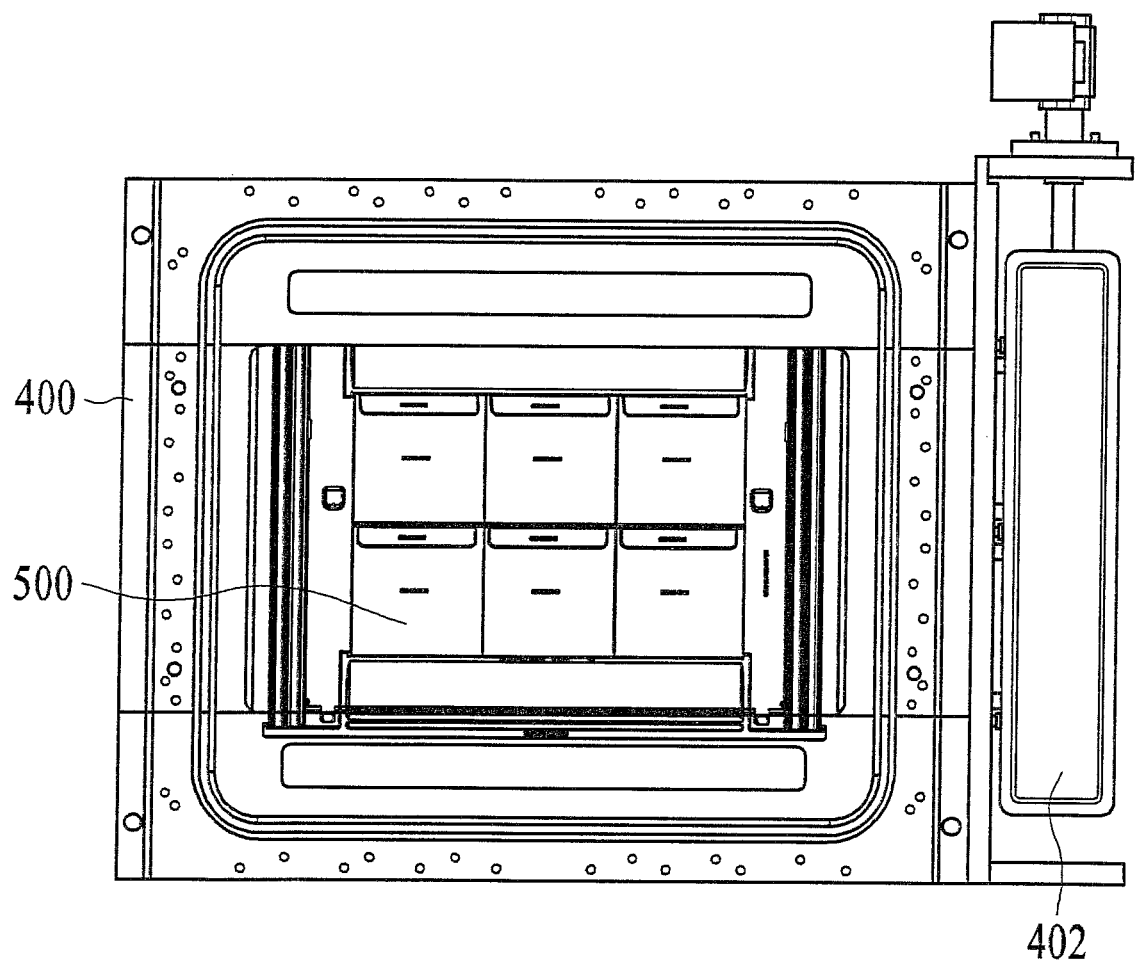
FIG. 5B shows a partial cut-away view along X-X of the epitaxial reactor of FIG. 4 with an open gate valve, the reaction chamber containing a substrate carrier, according to embodiments of the present invention.
Figure 5C:
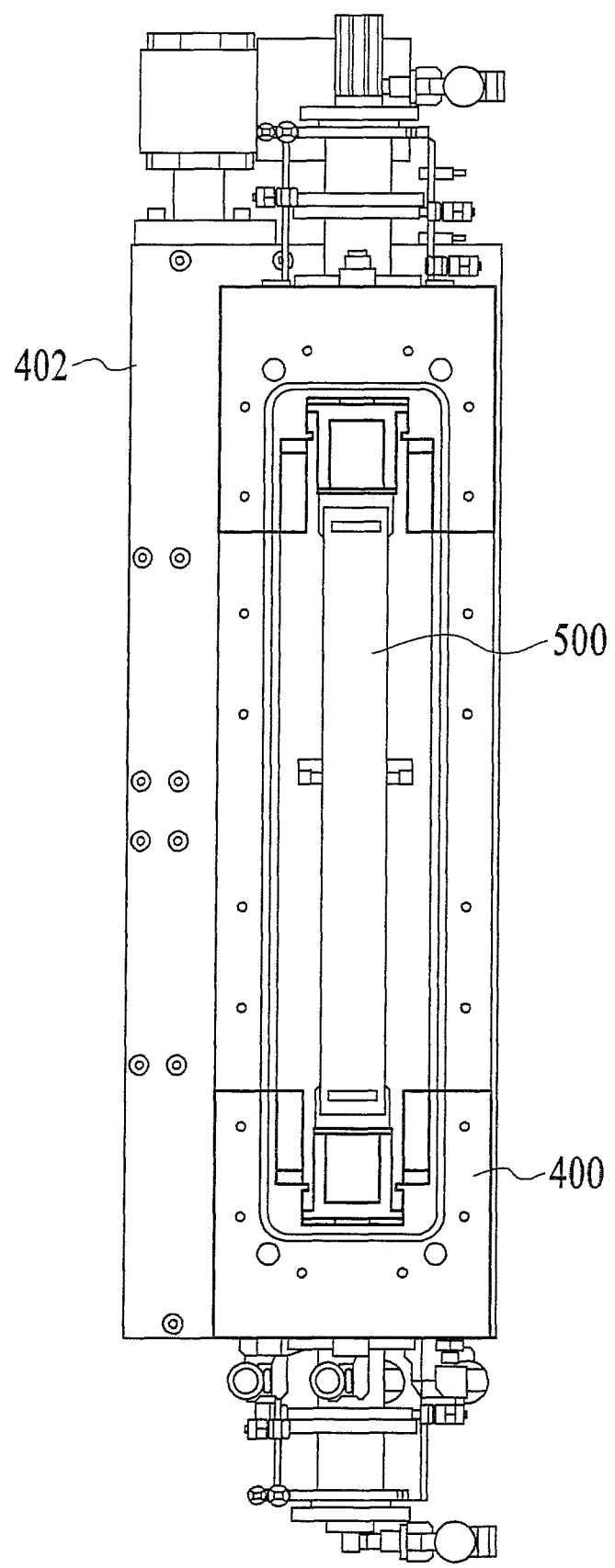
FIG. 5C shows an end view of the epitaxial reactor of FIG. 4, where the view is through the open gate valve showing the end of the substrate carrier, according to embodiments of the present invention.

FIG. 5A is a cut-away along X-X showing the interior of the process chamber 400 with a substrate carrier in processing position. Gas manifolds 405, heat chokes 505 and gas distribution channels 504 are shown at the top and bottom of the substrate carrier. The substrate carrier is shown in cut-away view such that only one layer of substrates 502 are shown on a susceptor 501—multiple layers of substrates are contained within the substrate carrier as will be apparent from FIGS. 7 & 8. FIGS. 5B & 5C show two partially cut-away views of the process chamber 400 with a gate valve 402 through which a substrate carrier 500 is inserted and removed.

As indicated above, the substrate carrier is removable from the reactor for ease of loading and unloading the substrates—through loadlock 402. Further details of substrate carrier removal are provided in U.S. Patent Application Publication No. US 2010/0263587 to Sivaramakrishnan et al. published on Oct. 21, 2010, incorporated herein by reference in its entirety.

As discussed below, the temperatures of the reactor components are controlled carefully so that silicon deposition occurs only within the substrate carrier, and primarily on the substrate surfaces. Furthermore, the substrate carrier may be configured to engage with the gas manifold in the reaction chamber of the reactor to contain process gases within the substrate carrier, thus enabling a low frequency of cleaning for the reaction chamber of the reactor and a high reactor availability. (Keeping process gases away from the windows 721 of the reactor and avoiding silicon deposition on the window surfaces. See FIGS. 7 & 8.) Consequently, only the removable substrate carrier will require frequent cleaning to remove deposited silicon, and this cleaning can readily be done outside the reactor. Note that the gas distribution channels 504 may also have some silicon deposited on their surfaces since the process gases are preheated as they travel through the channels, and therefore the gas distribution channels may also require cleaning. The gas distribution channels are incorporated into the removable substrate carrier to allow for ease of cleaning. Furthermore, the heat chokes 505 are in a transition region where there may be some small amount of silicon deposition and are also included in the removable substrate carrier for ease of cleaning.

The frequency of cleaning required for the substrate carrier depends on the thickness of silicon being deposited, among other factors, and can readily be determined by monitoring the process yield—it is expected that particulate generation will have the largest yield impact and will consequently drive the frequency of cleaning. The substrate carrier is cleaned using a standard silicon etch, such as $HF/HNO_3$.

Epitaxial Reactor: Substrate Carrier

In embodiments of the present invention throughput may be increased by a substrate carrier that is preferably characterized by low total heat capacity and high emissivity (black body type)—these properties allow for the carrier to rapidly be heated and cooled (low heat capacity) and also for the substrates within the carrier to rapidly reach uniform temperature (high emissivity). Furthermore, very small substrate carrier volume allows maximum usage of all reactant gases injected into the reactor. This is because (1) most of the substrate carrier volume is consumed by substrates and susceptor hardware and (2) most of the surface area inside the substrate carrier that is exposed to processing gases is covered with substrates so that minimal TCS is used to deposit silicon on non-substrate surfaces. Furthermore, the substrate carrier may be configured to reduce heat flow through the surfaces of the carrier that are not directly heated.

Figure 6:
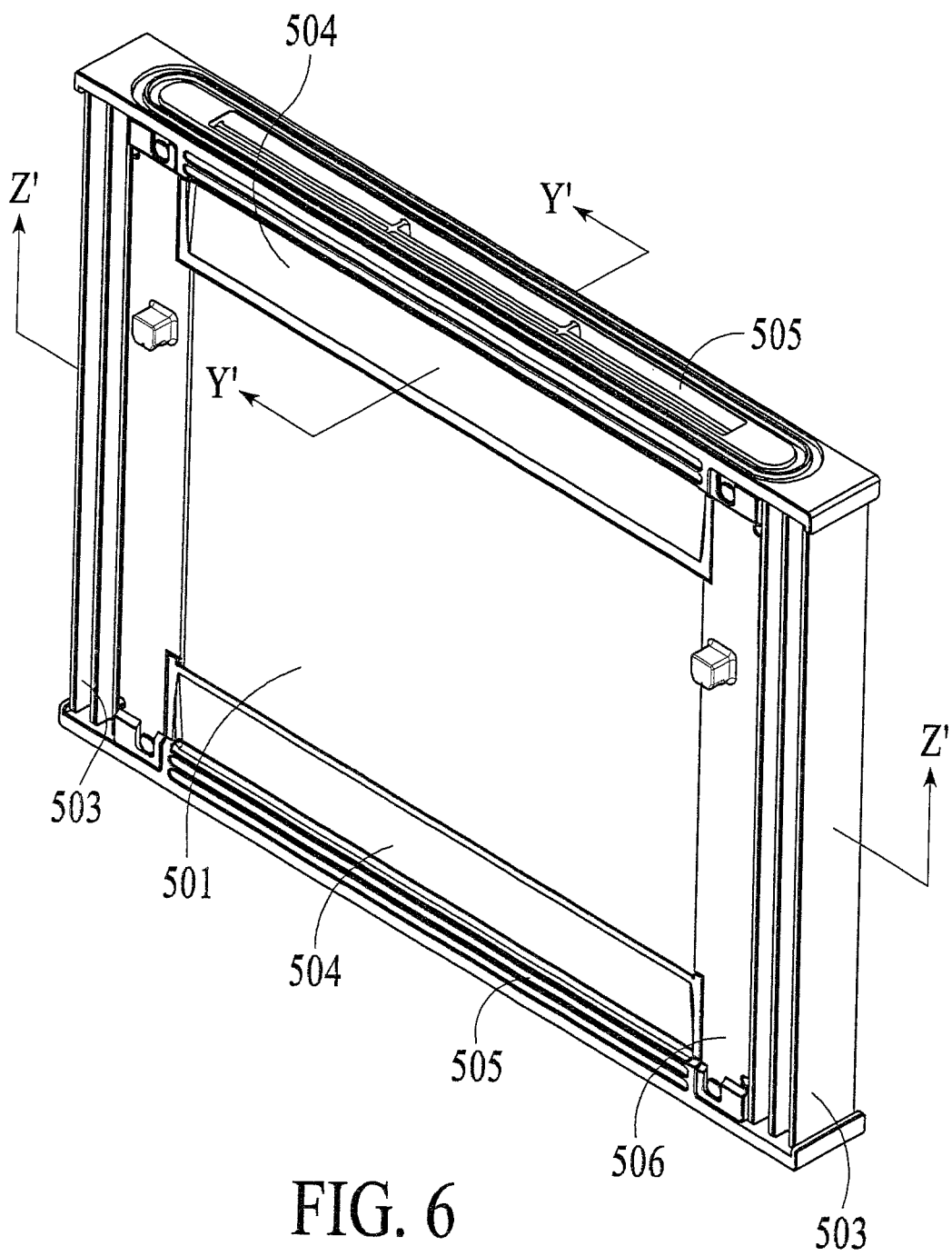
FIG. 6 is a perspective view of a substrate carrier, according to embodiments of the present invention.
Figure 7:
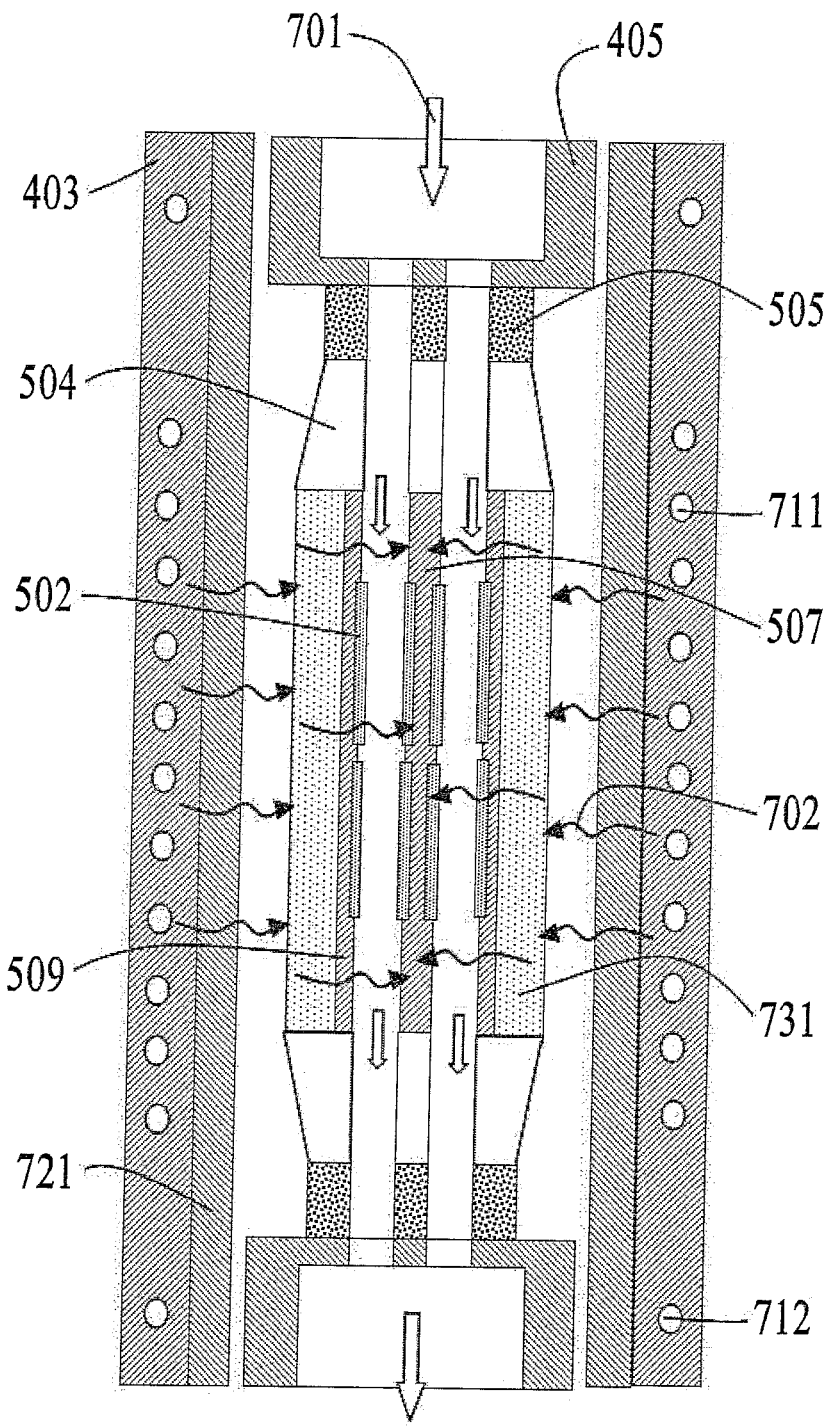
FIG. 7 is a simplified representation of a cross section along Y-Y of a first embodiment of the epitaxial reactor of FIG. 4, according to the present invention.
Figure 8:
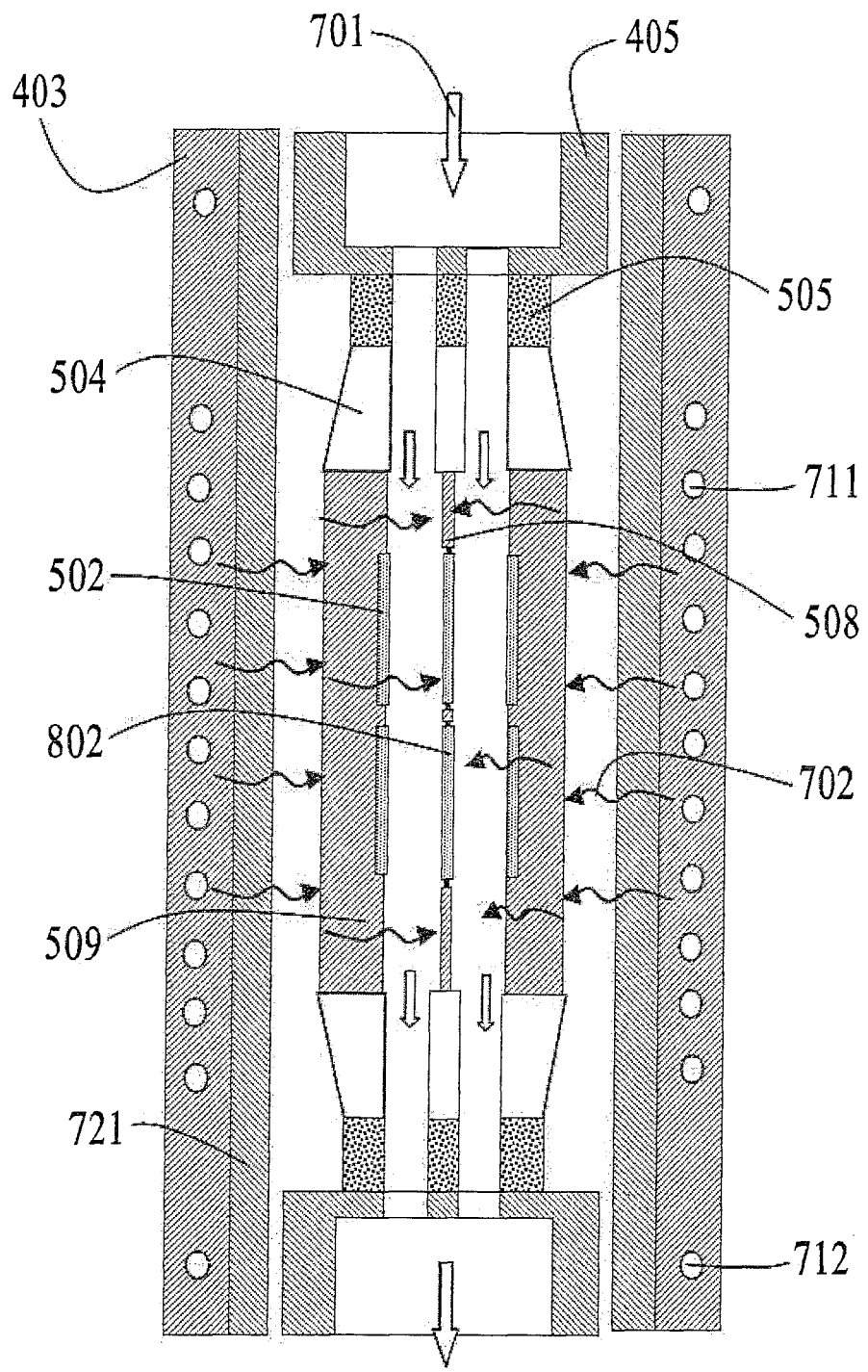
FIG. 8 is a simplified representation of a cross section along Y-Y of a second embodiment of the epitaxial reactor of FIG. 4, according to the present invention.

FIG. 6 shows a perspective view of an example of a substrate carrier 500 based on these concepts. FIGS. 7 and 8 show cross-sections along Y-Y of the reactor 400 of FIG. 4. Note that the cross-sections of FIGS. 7 and 8 also show cross sections of the substrate carrier 500 along Y'-Y' of FIG. 6. Furthermore, the cut-away view of FIG. 5, also shows parts of the substrate carrier. The substrate carrier 500 comprises susceptors 501 for holding substrates 502, heat reflectors 503 for reducing heat flow through the ends of the substrate carrier, gas distribution channels 504 at top and bottom, and heat chokes 505 at top and bottom for thermally isolating the substrate carrier 500 from the manifolds 405. Note that the large areas of the susceptors 501 on the outside of the substrate carrier 500 are heated directly by the lamp modules 403 through a window 721, and in the embodiment shown in FIG. 7, also through a transparent structural layer 731.

The heat reflectors 503 comprise a series of parallel plates with gas in between. See FIGS. 6 and 10—the latter showing the heat reflector in cross section. The plates nearest the substrates are generally made of silicon carbide or silicon carbide coated graphite and the plates furthest away from the substrates are generally made of quartz. During substrate processing the gas between the plates—generally hydrogen—is stagnant. The heat reflectors, so configured, provide high impedance to heat flow and assist in maintaining a stable temperature within the deposition area of the substrate carrier. Furthermore, when the substrate carrier is being cooled, nitrogen gas may be flowed through the spaces between plates to decrease the cooling time.

Heat chokes 505 may be made of silicon carbide coated graphite or quartz. The heat chokes may be configured in conjunction with a cooling jacket for efficient removal of heat. The cooling jacket 1090 is shown in cross section in FIG. 10—the cooling jacket is a part of the reaction chamber wall through which coolant flows in order to extract heat. Furthermore, gas flow over the fin-like surface of the heat choke may be used to extract heat during processing, when required, and during cooling of the substrate carrier.

The silicon deposition region of the epitaxial reactor is discussed in more detail with reference to FIGS. 7 & 8. Process gases—for which a first direction of flow is indicated by arrows 701—are directed into the interior volumes of the substrate carrier, which is enclosed by external susceptors 509 and the end caps 506 (see FIGS. 6 & 10). The process gasses flow through the upper gas manifold 405, through the interior volumes over the surfaces of substrates 502 and out through the lower gas manifold. The surfaces of the substrates 502 which are exposed to the interior volumes have release layers, which may be made of porous silicon as described in more detail below. The epitaxial deposition of silicon is on the release layers of the substrates 502. An interior susceptor 507/508 separates the interior volumes. The interior surfaces of the susceptors 509, 507/508 are covered with the substrates 502. Thermal radiation 702 is supplied by heat sources, such as lamp modules 403. The thermal radiation 702 is conducted through windows 721 to heat the susceptors 509, 507/508 and the substrates 502 mounted on the susceptors. The external susceptors 509 are heated and in turn produce thermal radiation which heats the interior susceptor 507/508. In order to cool the substrates and substrate carrier after epitaxial deposition is complete inert gases are flowed through the channels in the substrate carrier. This cooling process also purges any remaining process gases from the substrate carrier prior to removal from the reactor. Nitrogen gas at room temperature and atmospheric pressure, or perhaps with a slight over-pressure, is typically used as coolant and purge gas. Furthermore, cooling gases may also be flowed over the exterior surfaces of the substrate carrier within the reactor, and, as discussed above, the cooling gas may also be flowed over the heat chokes and through the heat reflectors to increase the cooling rate of the substrate carrier.

The internal channels through which the process gases flow at standard deposition flow rates are preferably configured so that the gas flow is laminar and there are no "dead" spaces where particulates might accumulate. Furthermore, the width of these channels—spacing between opposing substrate surfaces—will be chosen to ensure a suitable laminar flow regime given a particular deposition rate requirement. The deposition rate in depletion mode is a function of the flow rate, the $TCS/H_2$ ratio and the thickness of the boundary layer that exists at the surface of the wafers. Generally, channel widths are minimized in order to keep the substrate carrier compact and to keep the boundary layer small, and this minimum channel width increases as the desired deposition rate increases in order to maintain laminar flow. For example, a channel width of between 8 and 12 mm is suitable for a deposition rate of approximately 4 microns per minute with a TCS flow rate of 10-20 gms per minute. Furthermore, channel widths between 6 and 20 mm and flow rates of 2-90 gms per minute may be used, although the deposition rate will vary considerable over these ranges.

Referring to the arrows 701 in FIGS. 7 & 8 which indicate the direction of flow for the process gases, it should be noted that the flow direction may be reversed during processing— in which case the flow direction would be up instead of down as shown in the figures. When implemented during epitaxial deposition this is referred to as cross-flow processing. Cross-flow processing may be implemented in various ways, for example see U.S. Patent Application Publication No. US 2010/0263587 to Sivaramakrishnan et al. published on Oct. 21, 2010, incorporated herein by reference in its entirety. Furthermore, cross-flow processing may also be used during other process steps such as annealing of the separation layer, and also during cooling.

Furthermore, a structural layer 731 may be added to the outer surfaces of the substrate carrier—attaching to the outer surfaces of the external susceptors 509. See FIG. 7. The structural layers 731 provide extra support to the substrate carrier and are made of material which readily transmits the thermal radiation to the external susceptors 509, where the radiation is absorbed. The structural layers 731 may be made of quartz and the external susceptors 509 of silicon carbide, for example. The interior susceptor 507/508 may also be made of silicon carbide.

Yet furthermore, double sided substrates 802—that is substrates that are prepared with release layers on both sides and on which epitaxial silicon is deposited simultaneously on both sides within the epitaxial reactor—may be placed in a special susceptor plate 508 which permits exposure of the two sides of the substrates to two different channels for simultaneous epitaxial silicon deposition. See FIG. 8. Use of double-sided substrates may allow for an even lighter wafer carrier, hence even faster heat-up and cool-down processes, and thus higher throughput. The release layers may be porous silicon as described in more detail below.

The substrate carriers shown in FIGS. 7 & 8 are examples of particular embodiments of the present invention. Further embodiments of substrate carriers according to the present invention may: include more than one interior susceptor; and/or be configured to hold substrates for single sided and/or double-sided epitaxial deposition. Extra interior susceptors may be introduced in parallel to the other susceptors, forming extra channels through which process gases flow over the surfaces of substrates. These extra susceptors are heated by thermal radiation as described above for the case of a substrate carrier with a single interior susceptor. Furthermore, tilting the substrates—so that the substrates are at a small angle to the process gas flow direction—may be used to affect the thickness of the boundary layer. Specifically, where the channel through which the gas is flowing narrows, the flow increases and the boundary layer thickness is reduced; thus, tilting the substrate at an angle to the flow direction will increase the gas velocity and reduce the boundary layer thickness as the gas flows along the tilted substrate toward the end that impinges the most upon the channel. Substrate holders for tilting substrates are described in U.S. Patent Application Publication No. US 2010/0263587 to Sivaramakrishnan et al. published on Oct. 21, 2010, incorporated herein by reference in its entirety.

A substrate carrier such as shown in FIGS. 6-8 and 12 designed to carry twenty-four 125 mm square silicon substrates may be fabricated substantially from SiC and SiC-coated graphite, and have a total mass of no more than approximately 42 kilogrammes (without silicon substrates). Furthermore, if double sided substrates are used, this will result in a significant reduction in weight—perhaps 25-30% for a carrier with one interior susceptor, and 50% for a carrier with two interior susceptors. Such a substrate carrier may be heated using dual lamp modules 403 from 500 to 1,150° C. within approximately 15 minutes; the cool down time to 500° C. is of similar duration. As described above, the deposition system may be configured to allow removal of substrate carriers from the reactor while the substrate carrier is still at 400 to 600° C., thus reducing process cycle time through the reactor. Note that silicon carbide is used for its chemical inertness and purity, and high thermal emissivity. Components which may have silicon deposited on them are preferably made of silicon carbide since: (1) silicon adheres well; (2) silicon is readily removed from silicon carbide due to excellent selectivity for both wet and dry etch; (3) there is low diffusivity of common impurities in silicon carbide; and (4) good thermal properties that make silicon carbide a good choice for a thermal diffuser.

Epitaxial Reactor: Heat Source

Figure 9A:
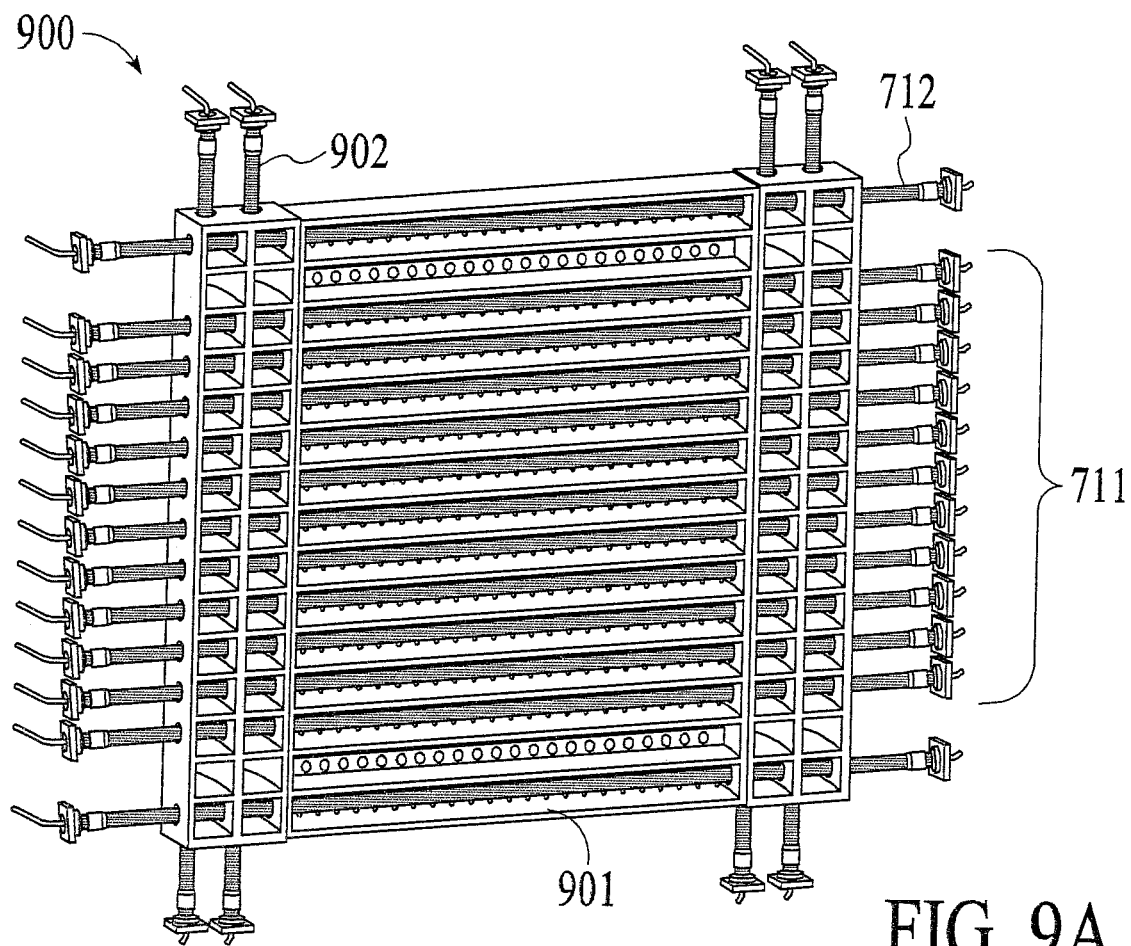
FIG. 9A is a perspective view of heat lamps and reflector structure of the epitaxial reactor and FIG. 9B provides a detailed view of one corner, according to embodiments of the present invention.
Figure 9B:
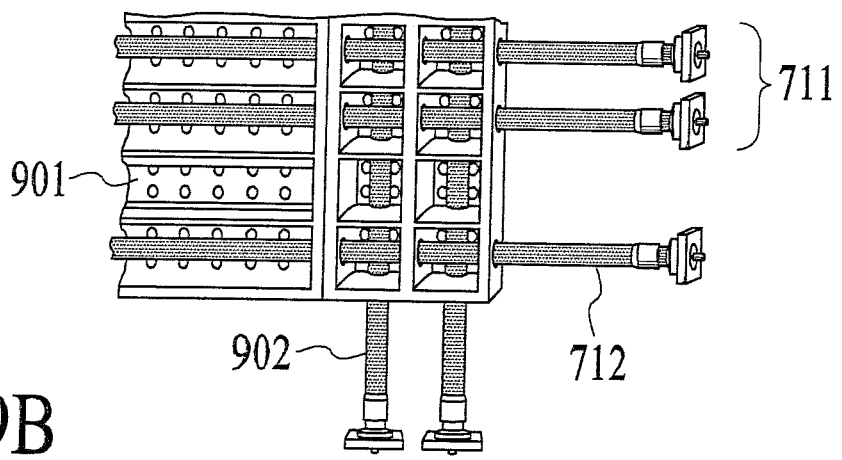

In embodiments of the present invention throughput may be increased at low cost by a heat source for heating the substrates in the reactor which has the following characteristics: (1) low heat capacity to enable rapid heat-up and efficient conversion of electrical energy to heat; (2) spatial control of heat delivered over the surfaces of the external susceptors; and (3) efficient reflector to ensure most of the heat generated is directed to the substrate carrier. Such a heat source is shown in FIGS. 9A & 9B. The heat source 900 comprises susceptor lamps 711, manifold lamps 712, and vertical lamps 902, all housed in a reflector 901. The lamps are controlled individually or in groups to enable uniform heating of the substrates and where required to control the temperature of different components of the substrate carrier and manifold. The heat lamps are configured to enable rapid uniform heat-up of the substrates to 1,200° C. and the power to the lamps is adjusted in real time to enable constant substrate temperature, even while the reactant gases are flowing. An example of a suitable lamp is a tungsten halogen lamp.

There are two heat sources 900 for each epitaxial reactor, as shown in FIGS. 7 and 8. In one particular embodiment of a reactor each set of lamps is rated at 110 kW, which is suitable for heating 36 silicon substrates, 125 mm×125 mm, to 1,150° C., and maintaining this temperature during processing when gas is flowing through the substrate carrier.

Figure 10:
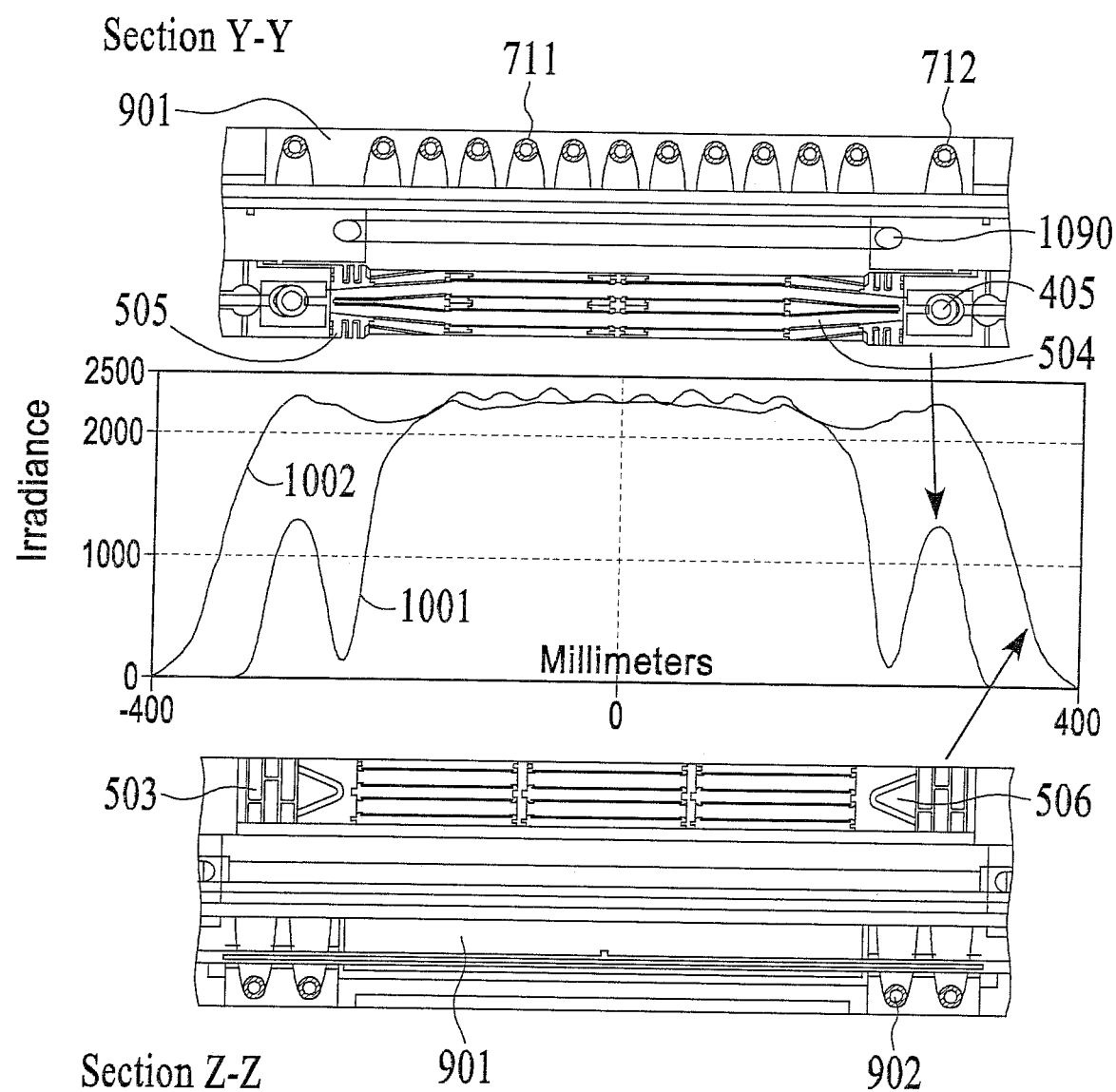
FIG. 10 shows horizontal and vertical cross-sections, along X-X and Y-Y through the epitaxial reactor of FIG. 4 and corresponding calculated temperature profiles, according to embodiments of the present invention.

FIG. 10 shows normalized irradiance profiles measured on the outside surface of the substrate carrier and the gas manifolds along the direction of gas flow—plot 1001—and perpendicular to the direction of gas flow—plot 1002. Note that the irradiance is proportional to temperature, but without accounting for heat losses. The irradiance is measured in watts per $mm^2$ (measured in the IR spectrum) as a function of position across the susceptor, measured in millimeters. Cross-sectional illustrations of the center part of the epitaxial reactor, showing part of the sections Y-Y and Z-Z, are provided above and below, respectively, the irradiance plots. Note that for convenience of illustration the second lamp module (on the opposite side of the substrate carrier) is not shown in these cross-sections. The plots 1001 and 1002 correspond to the illustrations above and below, respectively, as indicated by the arrows. The horizontal scale for the illustrations and the abscissa for the irradiance plots are in correspondence—for example, the side peaks in plot 1001 correspond spatially to the position of gas manifolds 405.

Irradiance plot 1001 shows how the temperature is controlled at the gas manifolds 405, thermal chokes 505, gas distribution channels 504 and at the susceptors and substrates. The gas is heated in the manifolds 405 by the dedicated lamps 712—the gas is heated to safely below the temperature at which dissociation of precursor gas or deposition from precursor gas occurs. The temperature is seen to drop in the thermal chokes 505 which provide some thermal isolation of the substrate carrier from the gas manifolds 405. The thermal isolation provided by the thermal chokes allows some degree of independent control of the temperature of the gas manifolds and the interior of the substrate carrier, as shown in FIG. 10. The temperature is then seen to increase along the gas distribution channels 504 from the thermal choke to the susceptors holding the substrates. (In some embodiments the surfaces of the channels through which process gas flows are covered with features—such as fins— to enhance heat transfer from the walls of the channels to the process gas. Such features are preferably engineered to improve heat transfer to the process gas while maintaining a uniform gas flow across the substrates.) The substrates and susceptors are maintained at a constant deposition temperature. The temperature of the gas distribution channels, susceptors and substrates is controlled by the row of lamps 711. Note that the symmetry in the temperature profile is necessary for two reasons: (1) to ensure uniform temperature of the substrates, and (2) to permit cross-flow processing, as described above.

Considering gas flow in one direction through the reactor, and with reference to section Y-Y and plot 1001 in FIG. 10, the gas is first preheated in one of the gas manifolds and then ideally the gas heats up towards deposition temperature as it flows along the first set of gas distribution channels, reaching deposition temperature just before it flows across the substrates. After flowing across the substrates, the depleted gas then flows along the second set of gas distribution channels before being exhausted through the second gas manifold. During cross-flow processing, the direction of gas flow is reversed and the exhaust manifold becomes the gas supply manifold, etc.

Irradiance plot 1002 shows how the temperature is controlled at the heat reflectors 503, end caps 506, and at the susceptors and substrates. The substrates and susceptors are maintained at a constant deposition temperature, and the end caps are kept at roughly the same temperature. The temperature is seen to drop through the heat reflectors. The temperature of the end caps, susceptors and substrates is controlled by the rows of lamps 711 in the lamp module which run the entire length of the substrate carrier. The lamps 902 are positioned for heating of the end caps and heat reflectors—the extra heat provided by lamps 902 is to ensure that the temperature across the entire width of the substrates and susceptors is the same, and to avoid the temperature dropping at the edges of the substrates and susceptors adjacent the end caps. Note that the symmetry in the temperature profile is necessary to ensure uniform temperature of the substrates.

Note that although the above examples describe situations in which the temperature across the susceptor is fairly uniform in the region where the substrates are held, embodiments in which the temperature is purposefully varied across the substrates are also envisaged. The temperature non-uniformity across the substrates would be used to assist in compensating for TCS depletion. The lamps in the lamp modules may be programmed to accommodate such a non-uniform temperature profile, wherein the power supplied to individual lamps or groups of lamps is independently controlled.

Epitaxial Reactor: Depletion Mode Deposition

Figure 11A:
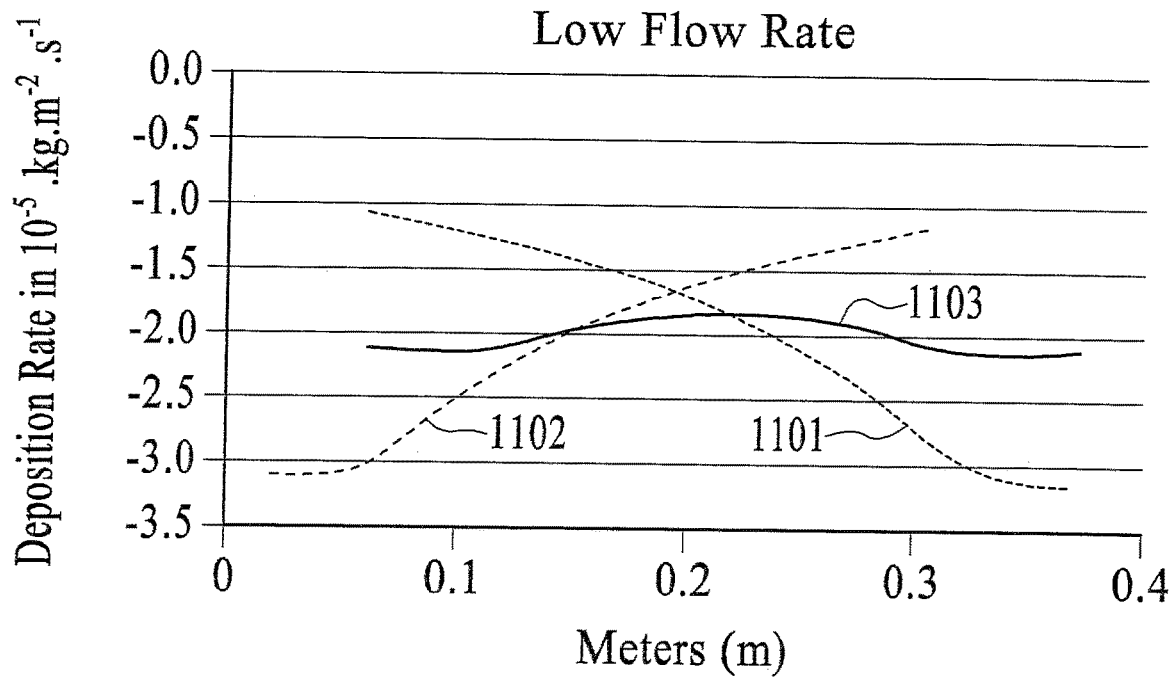
FIGS. 11A & B are an illustration of deposition in silicon precursor depletion mode and thickness averaging using cross-flow, according to embodiments of the present invention.
Figure 11B:
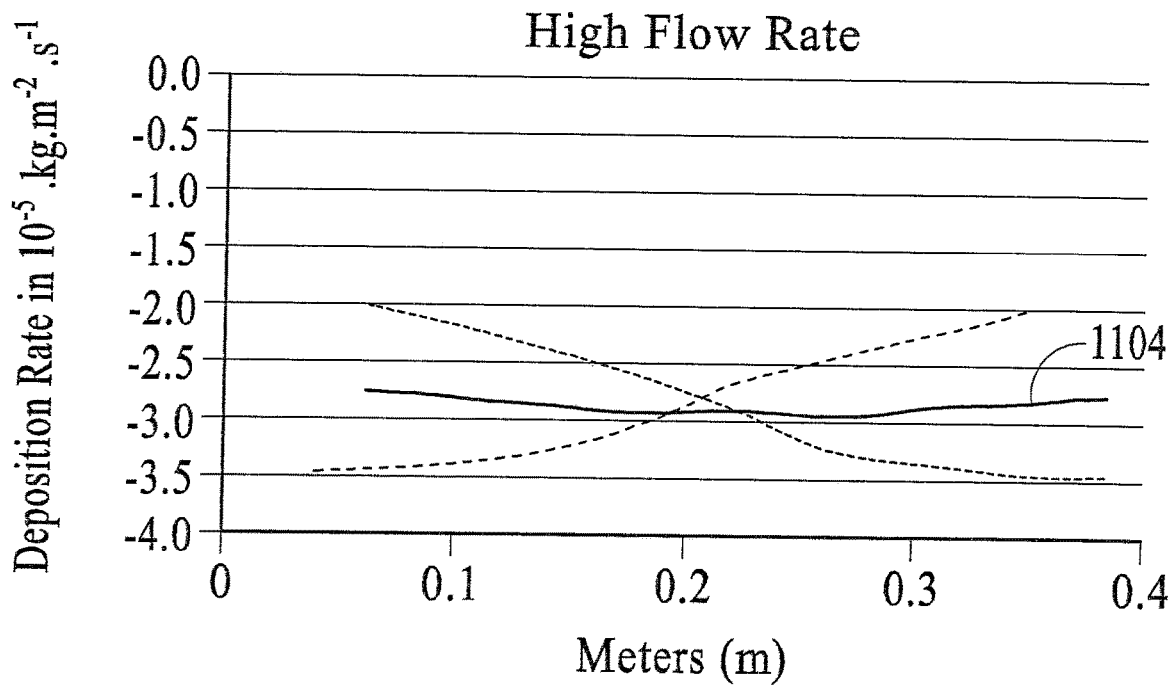

In embodiments of the present invention the cost of epitaxial silicon deposition may be reduced by operating the reactor in a TCS depletion mode so as to achieve the high TCS utilization required for low cost processes. For example, as the TCS precursor gas is flowed across the surface of substrates the TCS is consumed such that further downstream as the gas exits the substrate carrier, there is very little TCS present. Experiments in a prototype reactor design according to the present invention have shown up to 60% TCS utilization. As seen in FIG. 1, the deposition rate reduces drastically as the TCS gets depleted. Consequently, the thickness of silicon deposited on the substrates also reduces drastically along the direction of gas flow. Thus to compensate for the reduced thickness the direction of gas flow is reversed so that the region which had the low deposition rate now has the high deposition rate and vice versa. See curves 1101 and 1102 in FIG. 11A, which show the silicon deposition rate on the substrates along the direction of process gas flow—left to right and then right to left, respectively. Curve 1103 shows the average deposition rate for the two depositions, indicating that a relatively uniform film thickness can be achieved, although there is a small peak in the center. Conversely, curve 1104 in FIG. 11B shows a slight dip in the center. FIGS. 11A & 11B show that by varying the flow rate, a sufficiently uniform film thickness can be achieved; the low flow rate for FIG. 11A is in the region of 60 to 100 standard liters per minute (slm), and the high flow rate of FIG. 11B is in the region of 150 to 300 slm. Cross flow may be implemented in various ways, as described above with reference to FIGS. 7 & 8 and also see U.S. Patent Application Publication No. US 2010/0263587 to Sivaramakrishnan et al. published on Oct. 21, 2010, incorporated herein by reference in its entirety.

Although the concept of cross-flow is simple, in practice it is difficult to use cross-flow to achieve uniform thickness of deposited silicon on the substrates because the depletion profiles can be highly non linear—a salient feature of FIG. 1. However, adjustment of the $TCS/H_2$ ratio, temperature and flow rate so that the thickness profile is roughly linear and then reversing the flow direction, has been successfully implemented to average out the thickness variations. Using this technique, a rough averaging out between the flows in opposite directions achieves the required thickness variation of less than +/−10% while keeping the TCS utilization high.

Epitaxial Reactor: Further Features of Substrate Carrier

Further details of various embodiments of substrate carriers according to the present invention are shown in FIGS. 12A-12F, 13A-13C, 14A & 14B and 15A-15C.

Figure 12A:
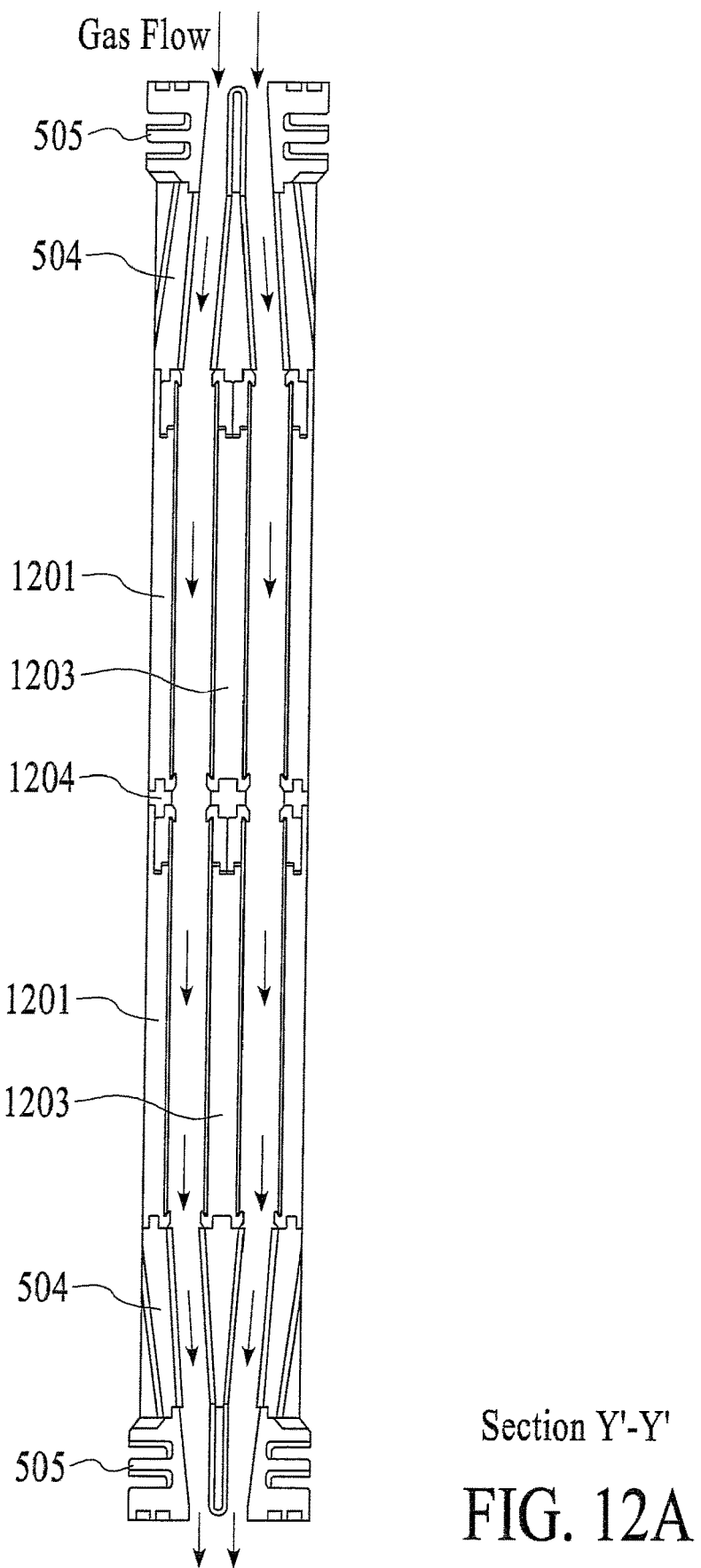
FIGS. 12A, B, C, D, E & F are cross-sections and plan views of a first embodiment of a substrate carrier and details thereof, according to the present invention.
Figure 12B:
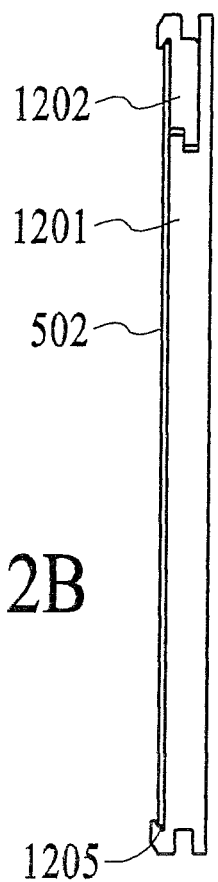
Figure 12C:
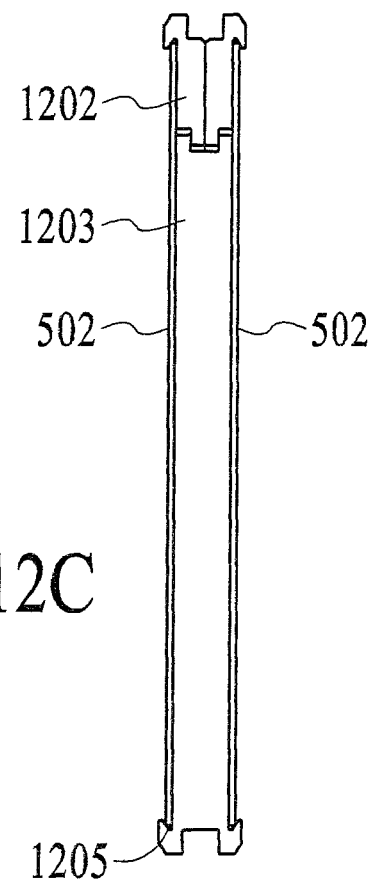
Figure 12D:
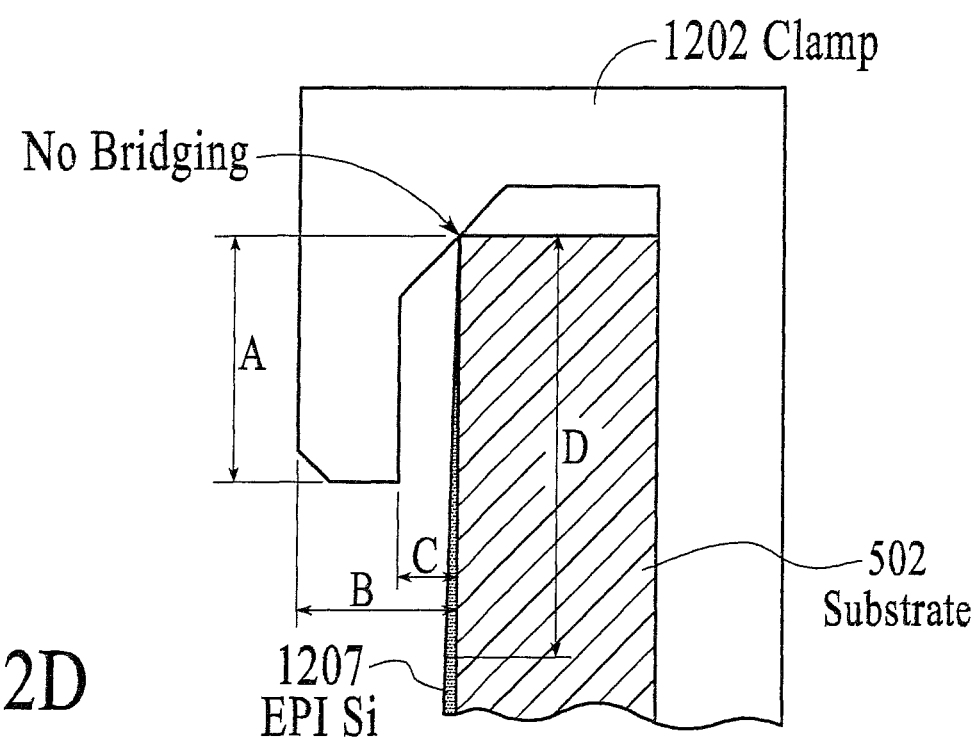
Figure 12F:
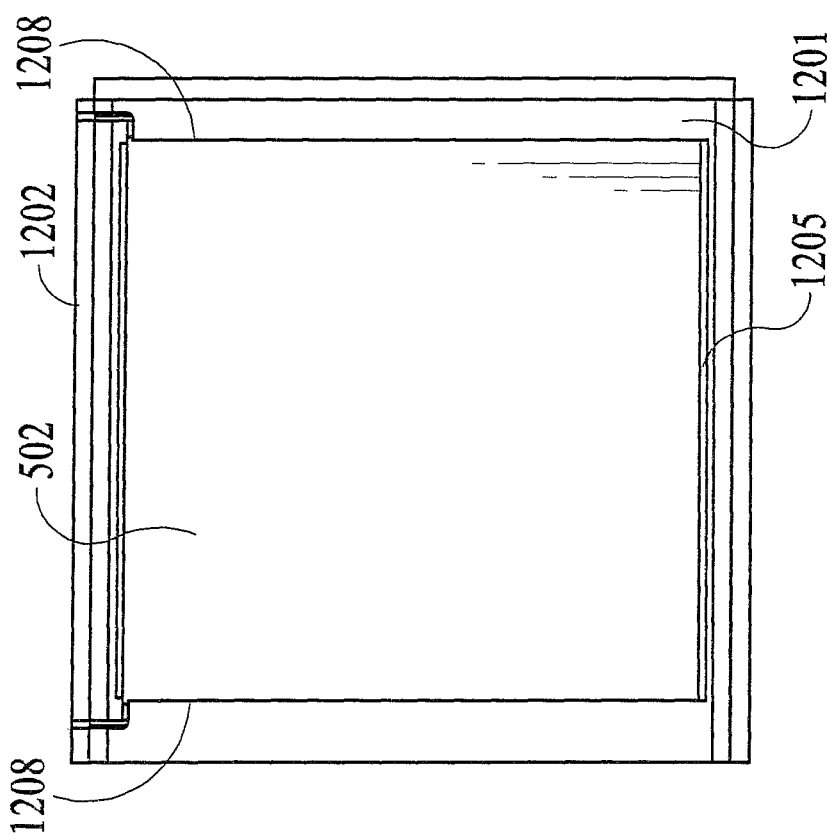
Figure 12E:
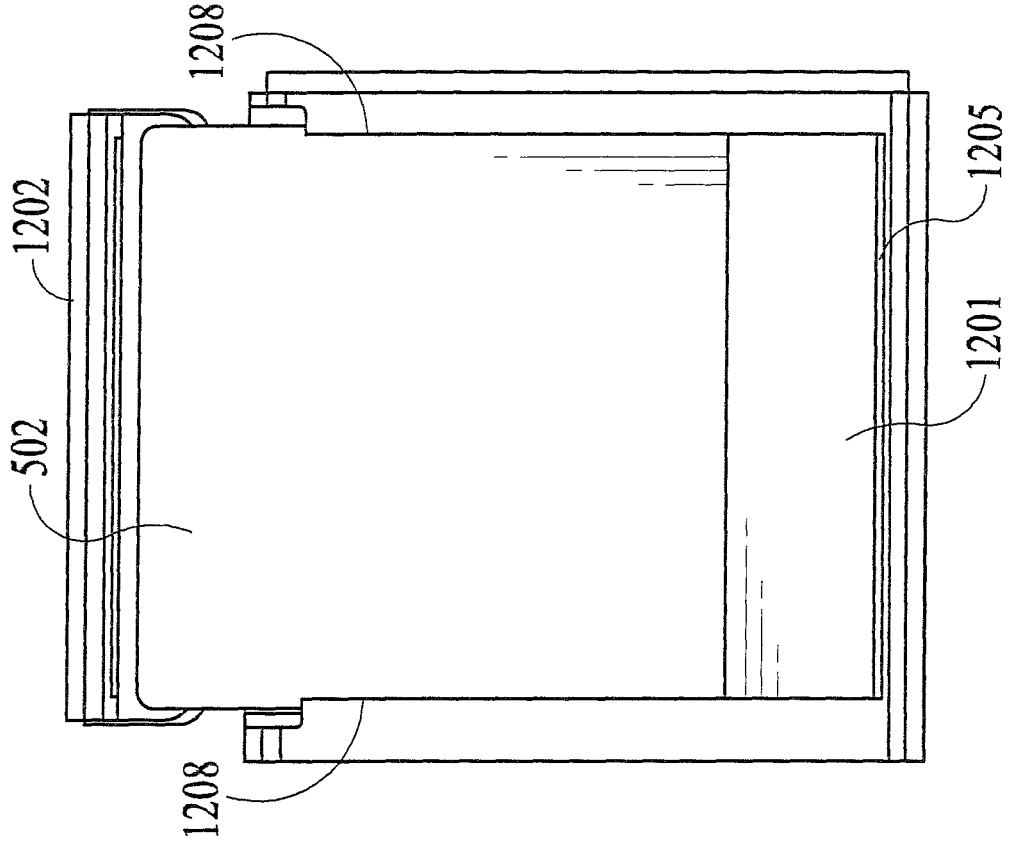

FIG. 12A shows a cross-section along Y'-Y' through a substrate carrier such as shown in FIG. 6. FIGS. 12B-12D show details of the substrate carrier and FIGS. 12E & 12F show plan views of the susceptor in the process of substrate loading (FIG. 12E) and with a substrate in place (FIG. 12F). With reference to FIGS. 12A-12C, 12E & 12F the carrier is shown to have outer susceptors 1201 and center susceptors 1203, where the susceptors are joined together by connector pieces 1204 as shown. The outer susceptors 1201 carry one substrate each and the center susceptors 1203 carry two substrates—one on each side; although, the center susceptors may also be configured for double-sided deposition (see cross-section of center susceptor 508 in FIG. 8). The substrates are slid into grooves 1208 in the susceptors and into slots 1205 at the bottom of the susceptors and are held in position by securing clamps 1202. Heat chokes 505 and gas distribution channels 504 are shown at the top and bottom of the carrier. An example of the gas flow through the substrate carrier is shown by the arrows.

A detail of a securing clamp 1202 is shown in FIG. 12D; the securing clamp has the same cross-section across the entire top edge of the wafer. Furthermore, the slots 1205 at the bottom of the susceptors 1201 and 1203, which capture the bottom edge of the wafer, have the same cross-sectional profile as shown in FIG. 12D, except for being inverted—the shape of the slots serves the same purpose as the shape of the clamp, described below, and accommodates reversing the gas flow direction across the wafer surfaces. Yet furthermore, the grooves 1208 which capture the vertical edges of the substrate have the same cross-sectional profile as shown in FIG. 12D, except for having greater tolerance to allow for ease of sliding the substrate in and out—the shape of the grooves 1208 serves the same purpose as the shape of the clamp, described below. The configuration of the securing clamp permits thicker silicon deposition over the surface of the substrate without bridging of epitaxially deposited silicon 1207 between the substrate and the susceptor. For example, 200 micron wafers may be deposited without bridging when the dimensions of the clamp are as follows: A=1.5 mm; B=1.6 mm; and C=0.5 mm Note that the non-uniform deposition of silicon at the edge of the substrate may be removed using trimming or scribing techniques prior to separation of the wafer from the substrate—the wafers are deliberately deposited on oversize substrates to allow for the loss of 1 or 2 mm around the edges.

FIGS. 13A-13C show perspective views of an alternative embodiment of a susceptor plate. Susceptor plate 1301 and removable slide 1302 hold substrate 1310 in place. The corners of the substrate 1310 have slots 1311 machined as shown in FIG. 13C. The detail of FIG. 13B shows a wedge 1303 attached to the removable slide 1302, the wedge fitting into the slot 1311 to hold the wafer in place. Furthermore, there are similar wedges at the other corners of the substrate, as seen in FIG. 13A. In the example shown in FIGS. 13A-13C, the susceptor is a center susceptor suitable for double-sided deposition (see cross-section of center susceptor 508 in FIG. 8); however, this same approach for holding substrates may also be used for outer susceptors, and for center susceptors configured for single-sided deposition (see cross-section of center susceptor 507 in FIG. 7).

Figure 14B:
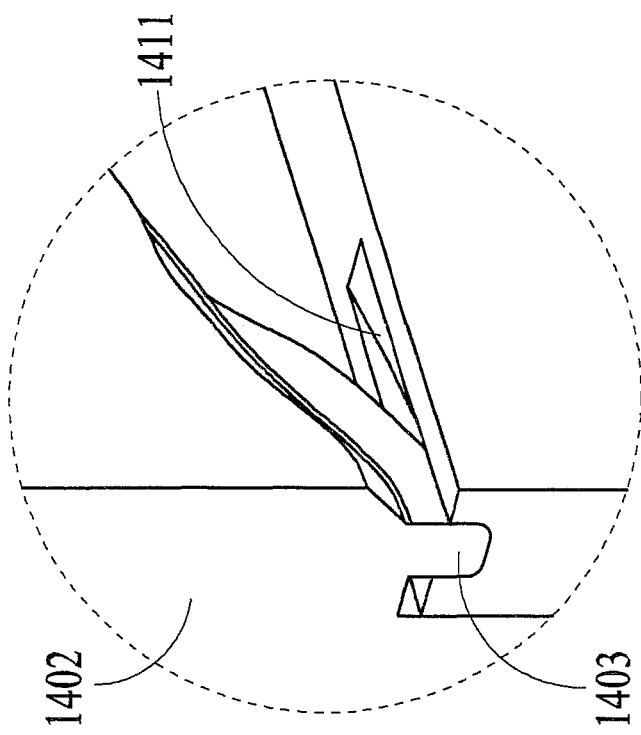
FIGS. 14A & B provide details of perspective views of a third embodiment of a substrate carrier, according to the present invention.
Figure 14A:
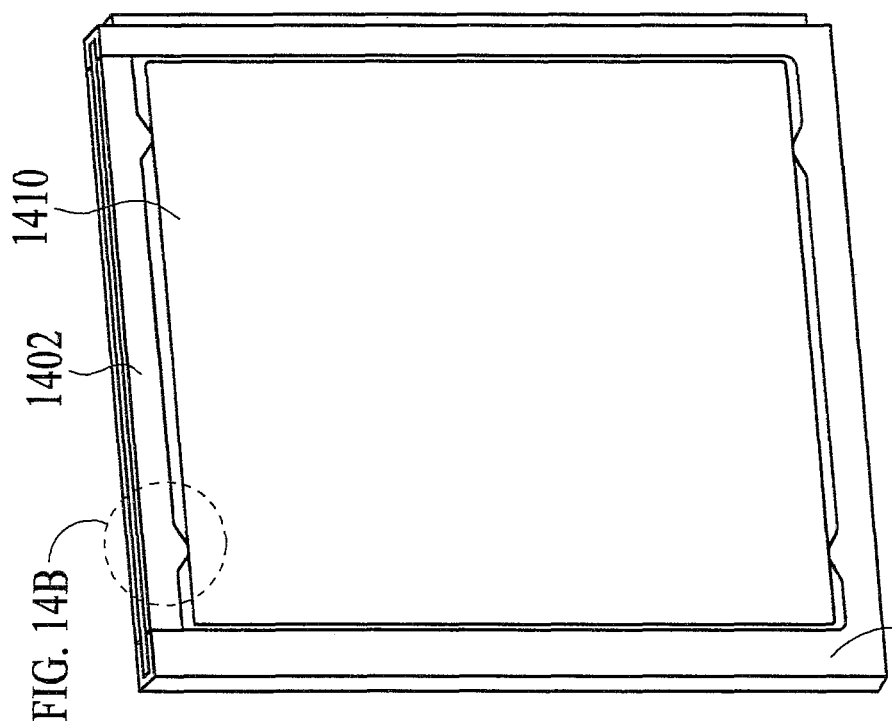

FIGS. 14A & 14B show a further embodiment of a susceptor plate. Susceptor plate 1401 and removable slide 1402 hold substrate 1410 in place. The edges of the substrate 1410 have grooves 1411 machined into them as shown in the detail FIG. 14B. Protrusions 1403 on removable slide 1402 mate with the grooves 1411 to hold the substrate 1410 in place. Note that protrusions are also located on the bottom inside edge of the susceptor plate 1401 which mate with grooves 1411 in the bottom edge of the substrate, as indicated in FIG. 14A. In the example shown in FIGS. 14A & 14B, the susceptor is an outer susceptor; however, this same approach for holding substrates may also be used for center susceptors—both for single-sided and double-sided deposition.

Figure 15A:
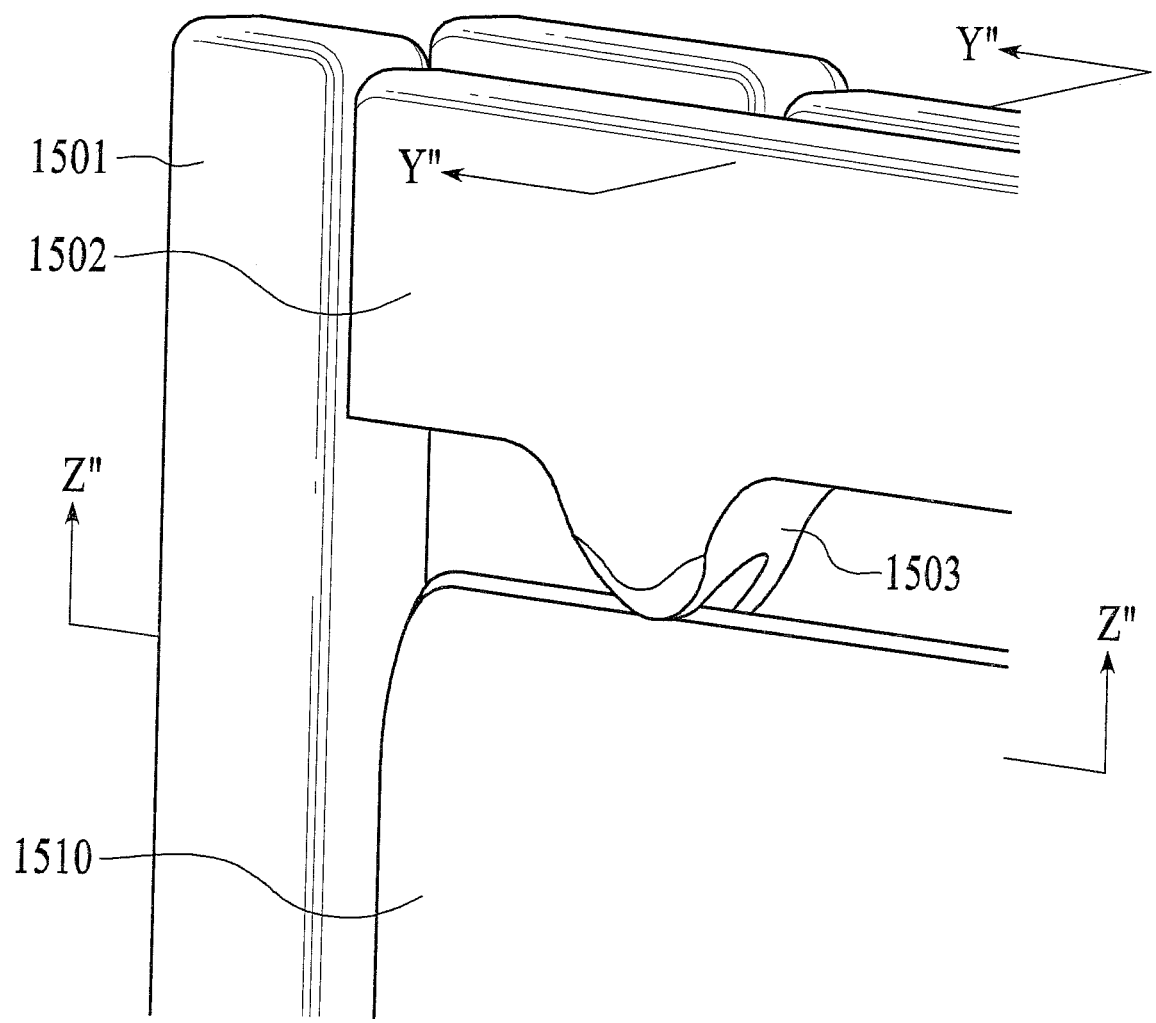
FIGS. 15A, B & C provide a detailed perspective view and cross-sections of a fourth embodiment of a substrate carrier, according to the present invention.
Figure 15B:
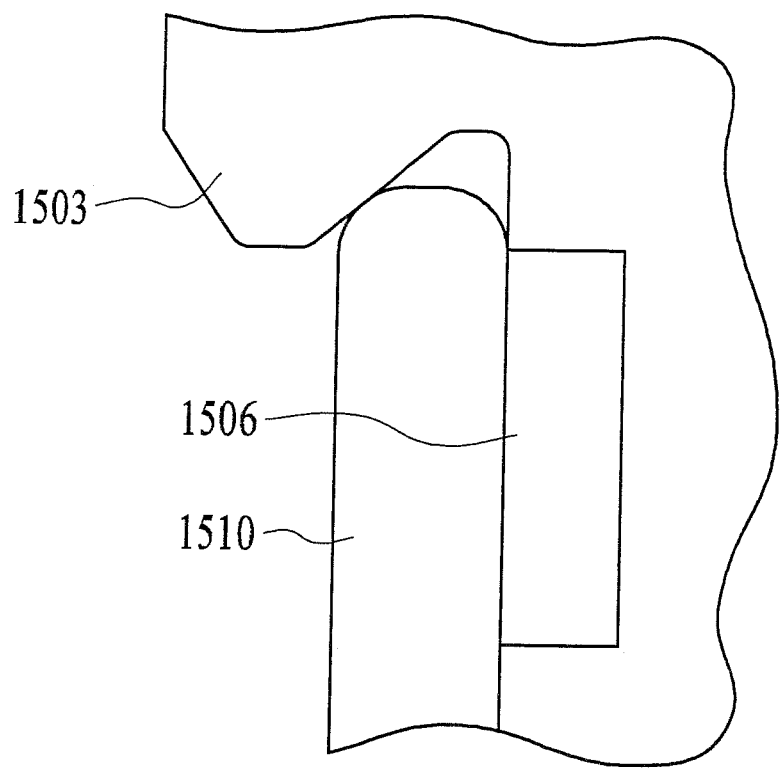
Figure 15C:
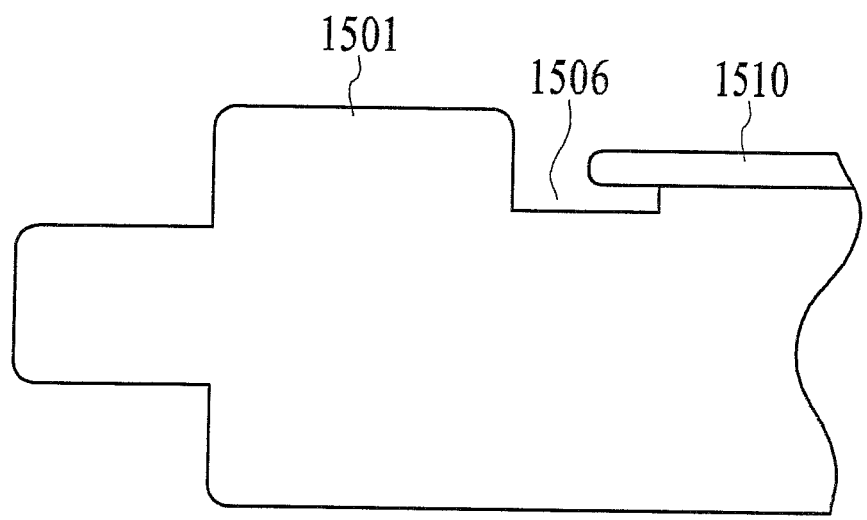

FIGS. 15A-15C show details of another embodiment of an outer susceptor plate. The configuration is the same as for the susceptor plate shown in FIGS. 14A-14B, except instead of four protusions configured to mate with grooves in the substrate edge there are four clamps 1503 for capturing the substrate 1510—two at the top edge and two at the bottom edge of the substrate. In this embodiment, there is no need for the substrate 1510 to have any grooves machined into the substrate edge. FIG. 15A shows susceptor plate 1501 and removable slide 1502 holding substrate 1510 in place. FIG. 15B shows a cross-sectional detail of the clamp 1503, showing how the top edge of the substrate 1510 is captured. The dimensions and angle of surfaces of the clamp 1503 are adjusted to permit thicker silicon deposition over the surface of the substrate without bridging of silicon between the substrate and the susceptor/slide at the position of the clamps 1503. Furthermore, there is a recess 1506 under the edge of the substrate 1510, the recess running around the entire substrate perimeter. FIG. 15C is a cross-sectional view in the Z"-Z" plane showing the recess 1506, which is part of the susceptor 1501, under the horizontal edge of the substrate 1510. The recess is configured as shown in FIG. 15B along the top and bottom edges of the substrate, except where the clamps are positioned. At the position of the clamps the recess is configured as shown in FIG. 15B. The recess is configured to reduce bridging of silicon between the substrate and the susceptor/slide during deposition. For example, a recess of approximately 1 mm under the edge of the substrate was sufficient to avoid bridging when depositing five 200 micron thick wafers on the substrate. (After these five depositions the susceptor is cleaned to remove silicon build-up.) Note that the recess also permits some silicon deposition around the edge of the substrate. Furthermore, note that the non-uniform deposition of silicon at the edge of the substrate may be removed using trimming or scribing techniques prior to separation of the wafer from the substrate—the wafers are deliberately deposited on oversize substrates to allow for the loss of 1 or 2 mm around the edges.

Furthermore, the recess 1506 around the perimeter of the substrate may be integrated into the single-sided deposition configuration of the susceptors/slides of FIGS. 13 and 14.

The susceptor plates shown in FIGS. 12E, 12F, 13A and 14A are configured for carrying single substrates, and multiple of these susceptor plates are connected together to form a susceptor plate for carry multiple substrates, as shown in FIG. 12A; however, susceptor plates may be configured to carry multiple substrates—for example, a susceptor plate may be configured for holding three substrates in a horizontal row, such that the susceptor plate 501 could be made up of two such "half" plates connected one above the other. Furthermore, the susceptor plate 501 may be a single plate configured to hold all six substrates. See FIG. 5A.

The process of loading substrates follows the following general steps. Substrates are loaded into susceptor plates, the bottom edge of the substrate being captured by a slot or other retaining features. A retaining clamp or slide is then slid into place over the top edge of the substrate. The loaded susceptor plates are then assembled in the substrate carrier, which may include inserting connector pieces between the separate susceptors. The substrate carrier is then fully assembled by adding top gas distribution channels and thermal chokes. For example, see the cross-sectional view in FIG. 12A.

Epitaxial Reactor: Gas Manifold

A gas manifold is preferred that can act as an injector for the reactant gases but also as an exhaust, so that cross-flow processing can be efficiently implemented. An embodiment of the manifold 405 is shown in perspective in FIG. 16. The manifold 1600 has a body 1601, gas inlet tube 1602, gas exhaust tubes 1603, separation plate 1604 for separation of inlet and exhaust gases as explained in more detail below, gas exhaust apertures 1605, gas inlet slit 1606 and alignment ridges 1620 for alignment and sealing of the gas manifold to the substrate carrier.

Figure 16:
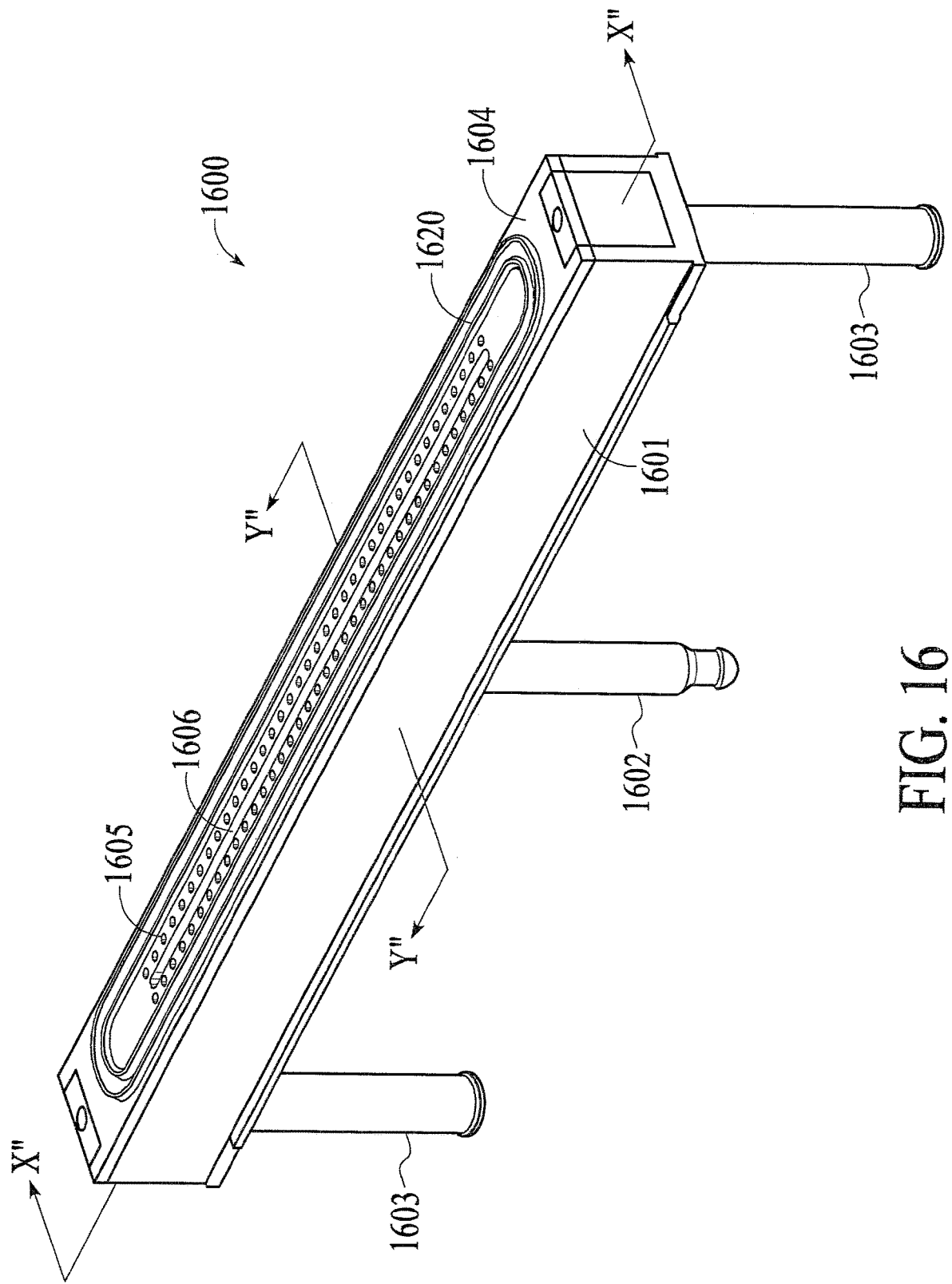
FIG. 16 is a perspective view of a gas manifold, according to embodiments of the present invention.
Figure 17:
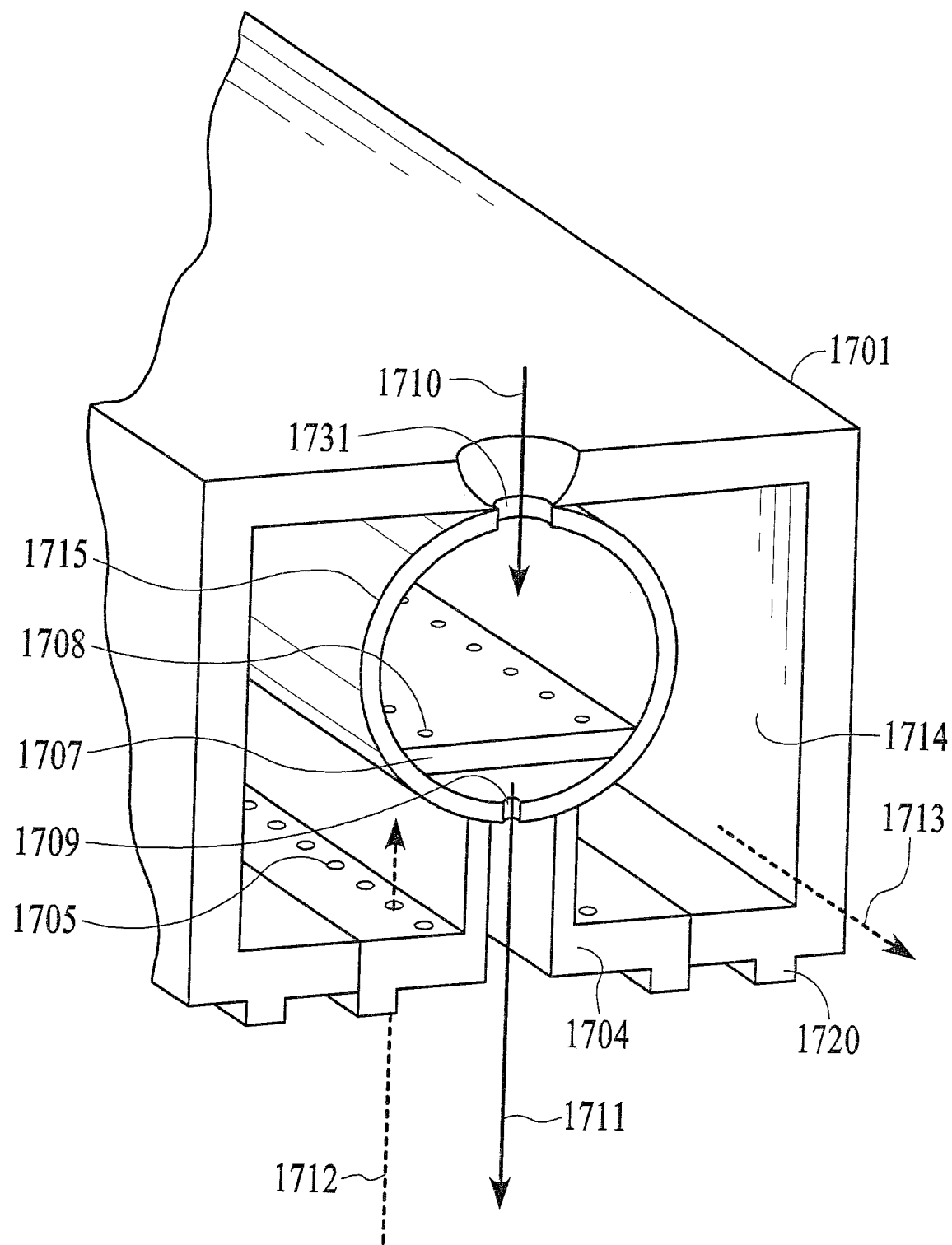
FIG. 17 is a perspective view of a first embodiment of the gas manifold of FIG. 16 cut in a plane parallel to the plane of the section Y"-Y", according to the present invention.

FIG. 17 shows a view of a first embodiment of the manifold of FIG. 16 which has been cut in a plane parallel to the plane of the section Y"-Y", which is also parallel to the plane of the section Y-Y of FIG. 4. The manifold has a long square section pipe body 1701 through which one or more apertures 1731—perhaps two or three—have been formed. The apertures 1731 are connected to external gas supply lines for providing process gases to the manifold. A circular cross-section pipe 1715 is welded to the interior of pipe 1701. Apertures 1731 extend through pipe 1715 as well. A gas diffuser plate 1707 with a plurality of evenly spaced small apertures 1708, formed in two rows along the length of the pipe 1701, separates the inlet part of pipe 1715 from the outlet part and ensures a uniform process gas delivery from the manifold to the interior of the substrate carrier 500 along the length of the manifold through a multiplicity of apertures 1709 arranged uniformly along the length of the pipe 1701; although, the arrangement of apertures 1708 may be varied providing the function of the diffuser plate is preserved. Flow of process gas through the manifold is indicated by arrows 1710 and 1711. A plate 1704 is integrated into pipe 1701 in order to ensure complete separation of process gases and exhaust gases. Plate 1704 includes a large number of apertures 1705 through which the substrate carrier is exhausted; although, in this particular example the apertures 1705 are uniformly spaced in rows along the length of the manifold, other arrangements of the apertures 1705 may be used providing efficient exhausting of gas is achieved. Flow of exhaust gases is indicated by arrows 1712 and 1713. The exhaust gases flow along the length of the manifold through chamber 1714 and are removed at either end through an exhaust gas line (1603, for example) attached to a vacuum pump. Note that the manifold is used in either a process gas supply mode or an exhaust mode only—not in both modes at once. The configuration of the manifold shown in FIG. 17 permits very rapid switch of gas flow direction without mixing of exhaust and process gases, and also provides a higher impedance gas inlet (suitable for efficient process gas preheating) and a lower impedance gas exhaust. Furthermore, as described in more detail below, the substrate carrier may be configured to engage with the gas manifold in the reaction chamber of the reactor to contain process gases within the substrate carrier, thus enabling a low frequency of cleaning for the reaction chamber of the reactor and a high reactor availability.

Figure 18A:
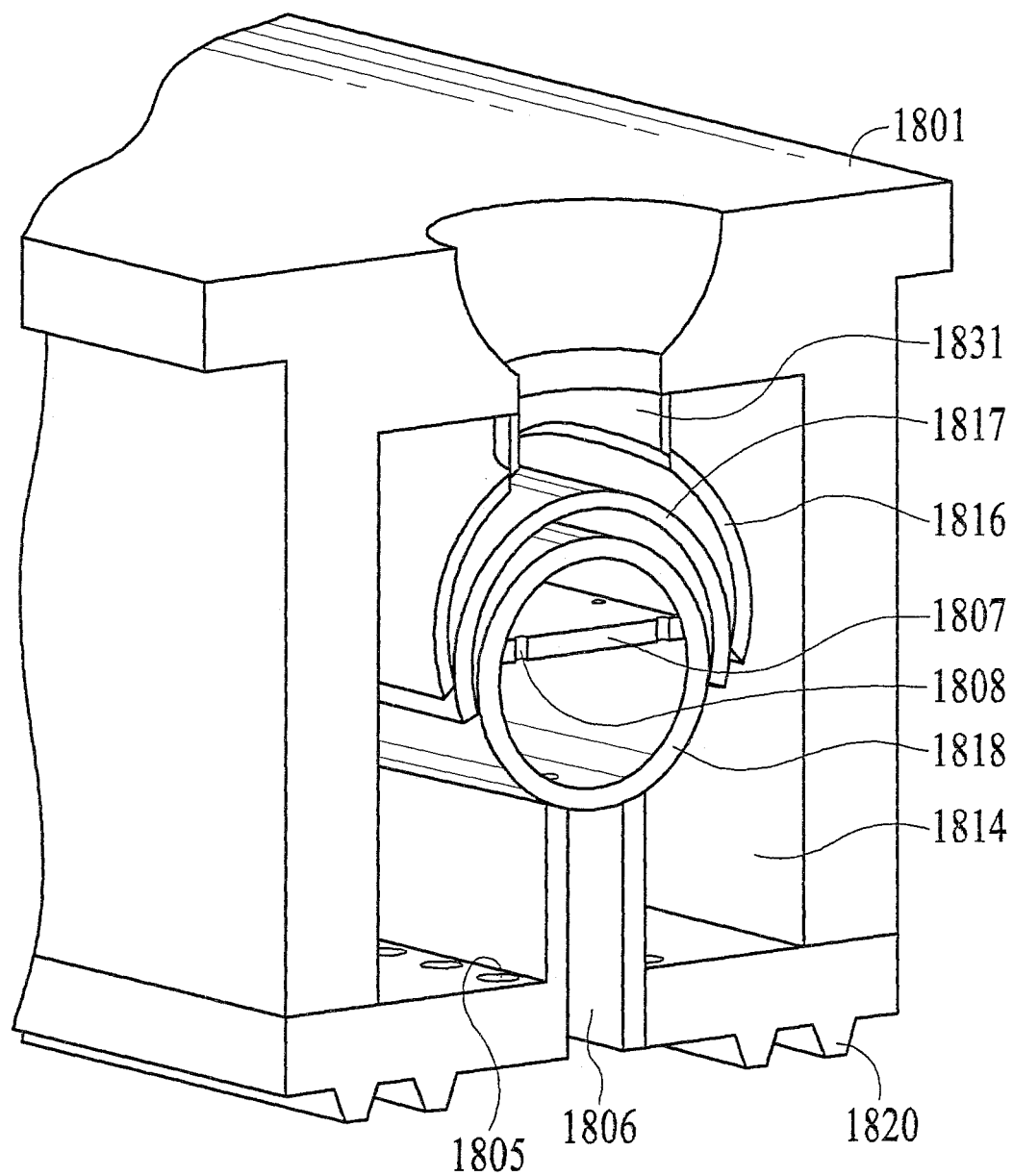
FIG. 18A is a perspective view of a second embodiment of the gas manifold of FIG. 16 cut in a plane parallel to the plane of the section Y"-Y", according to the present invention.
Figure 18B:
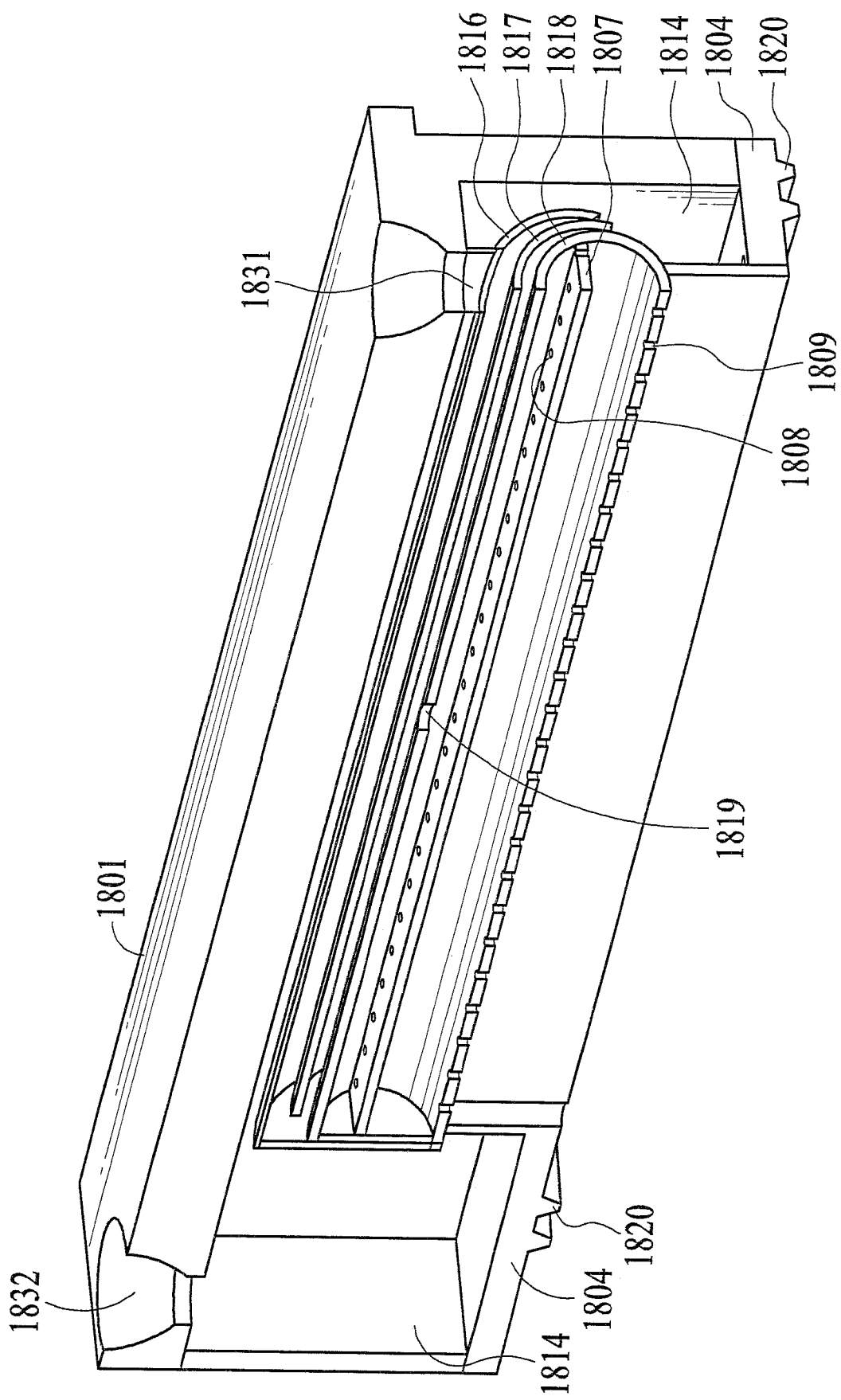
FIG. 18B is a perspective view of the gas manifold of FIG. 18A cut in a plane parallel to the plane of the section X"-X" in FIG. 4, according to the present invention.

Furthermore, the manifold may be configured to increase the path length of gas through the manifold in order to improve gas preheating, should this be required. For example, FIGS. 18A and 18B show perspective views of a manifold design with a longer process gas path length through the manifold. The manifold has been cut in planes parallel to the planes of the sections Y"-Y" and X"-X" of FIG. 16; FIG. 18B shows only half the length of the complete manifold. The manifold has a long square section pipe body 1801 through which one or more apertures 1831—perhaps two or three—have been formed. The apertures 1831 are connected to external gas supply lines for providing process gases to the manifold. A series of tube sections 1816 and 1817 and tube 1818 are attached to the interior of pipe 1801. Apertures 1831 extend through pipe section 1816 as well. After gas enters the manifold through apertures 1831 it must flow to the end of the manifold to get around the baffle 1817, then back along the length of the manifold to go through apertures 1819 into pipe 1818. In pipe 1818 there is a gas diffuser plate 1807 with a plurality of evenly spaced small apertures 1808, formed in two rows along the length of the pipe 1818, separating the inlet part of pipe 1818 from the outlet part. The diffuser plate ensures a uniform process gas delivery from the manifold to the interior of the substrate carrier 500 along the length of the manifold through a multiplicity of apertures 1809. A plate 1804 is integrated into pipe 1801 in order to ensure complete separation of process gases and exhaust gases. Plate 1804 includes a large number of apertures 1805 through which the substrate carrier is exhausted, generally as described above for FIG. 17. The exhaust gases flow along the length of the manifold through chamber 1814 to either end of the manifold where they are exhausted through apertures 1832, which are connected to a vacuum pump by an exhaust line (1603, for example).

Figure 19A:
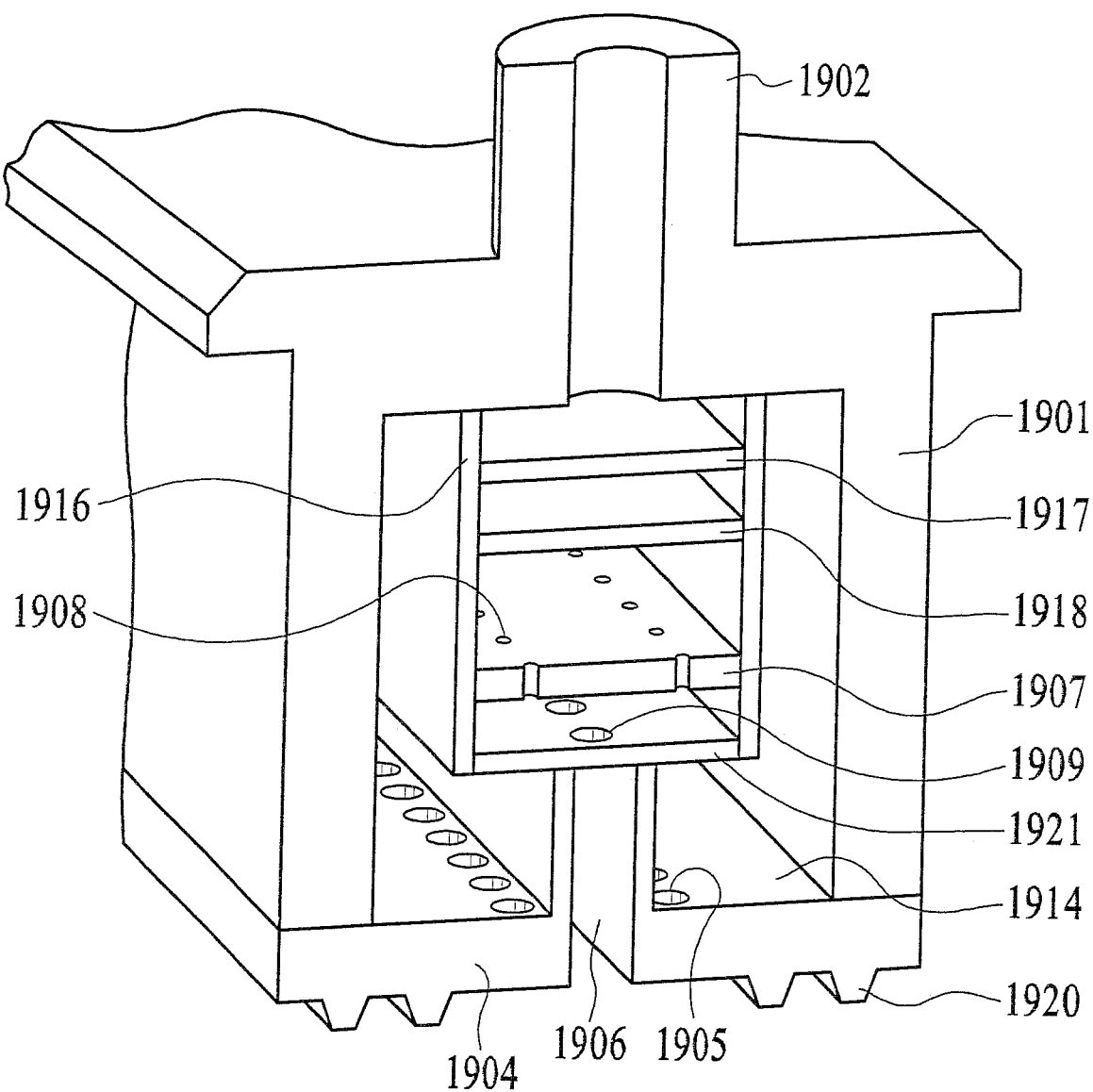
FIG. 19A is a perspective view of a third embodiment of the gas manifold of FIG. 16 cut in a plane parallel to the plane of the section Y"-Y", according to the present invention.
Figure 19B:
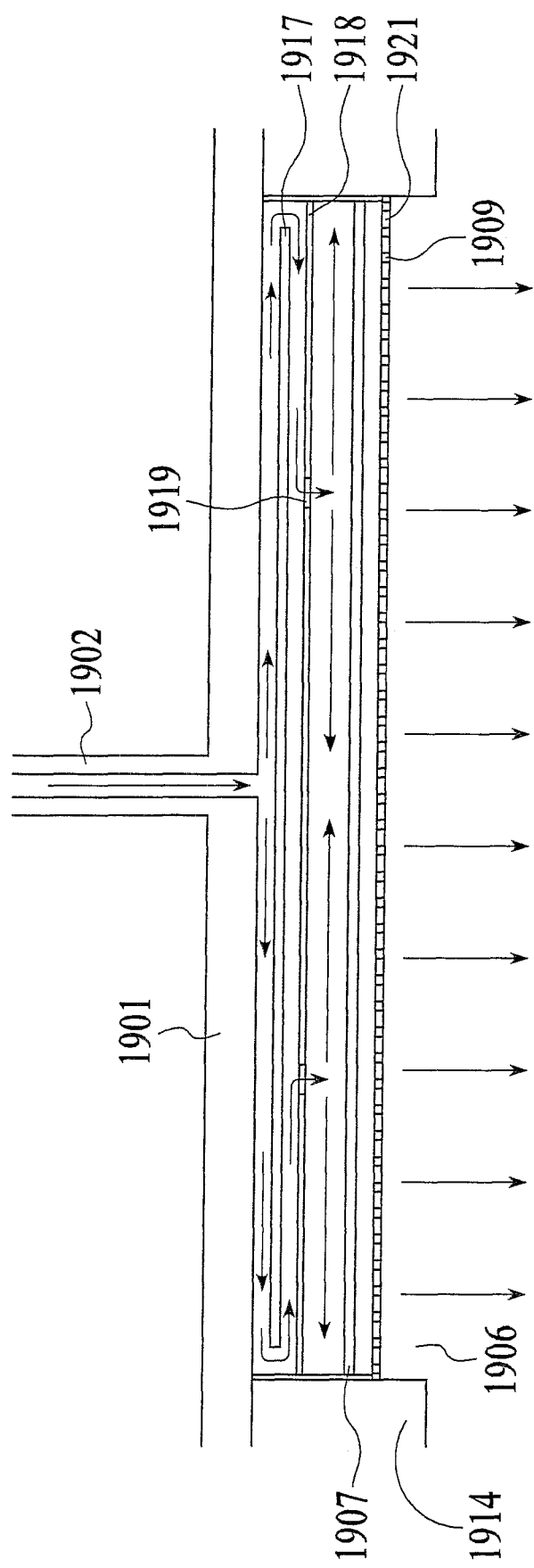
FIG. 19B is a cross-sectional view along X"-X" of the gas manifold of FIG. 19A, according to the present invention.

FIGS. 19A & B show a variation on the embodiment of the manifold shown in FIGS. 18A & 18B. FIGS. 19A and 19B show perspective views of a manifold design with a longer process gas path length through the manifold. FIG. 19A shows a view of the manifold cut in a plane parallel to the plane of the section Y"-Y" of FIG. 16; FIG. 19B shows a cross-section in plane X"-X" of FIG. 16, and indicates the inlet gas flow through the manifold. The manifold has a long square section pipe body 1901. Gas inlet tubes 1902—perhaps two or three—provide process gases to the manifold. A rectangular section box, with side walls 1916 and bottom plate 1921, is attached to the interior of pipe 1901. Contained within the box are a baffle 1917, a plate 1918 with apertures 1919, and a gas diffuser plate 1907 with a plurality of evenly spaced small apertures 1908, formed in two rows along the length of the manifold. After gas enters the manifold through inlet tube 1902 it must flow to the ends of the manifold to get around the baffle 1917, then back along the length of the manifold to go through apertures 1919. The gas must then pass through a diffuser plate 1907 through a multiplicity of apertures 1908 and then through a multiplicity of apertures 1909 in plate 1921 into the gas inlet slit 1906 which delivers the gas from the manifold to the interior of the substrate carrier 500 along the length of the manifold. A plate 1904 is integrated into pipe 1901 in order to ensure complete separation of process gases and exhaust gases. Plate 1904 includes a large number of apertures 1905 through which the substrate carrier is exhausted, generally as described above for FIG. 17. The exhaust gases flow along the length of the manifold through chamber 1914 to either end of the manifold from where the gases are exhausted to a vacuum pump by an exhaust line (1603, for example).

The components of the manifold may be fabricated from quartz or SiC, for example.

Figure 20:
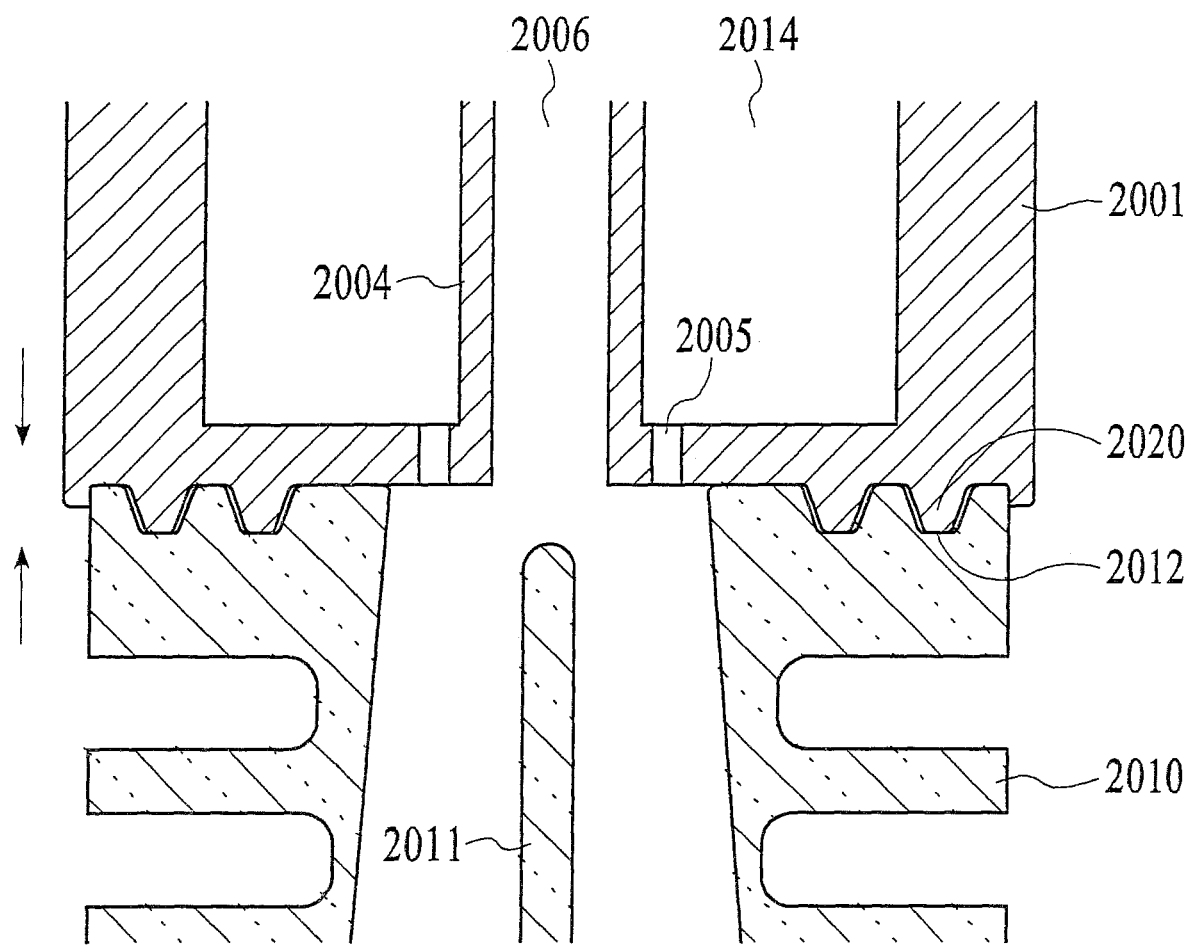
FIG. 20 is cross-sectional detail view of the interface between the gas manifold and the substrate carrier, according to embodiments of the present invention.

FIG. 20 is a cross-section in a plane parallel to the plane of Y-Y showing a detail of the engagement of the gas manifold to the substrate carrier. FIG. 20 shows the following parts of the manifold: the bottom part of the manifold body 2001, separation plate 2004 with exhaust apertures 2005, gas inlet slit 2006, exhaust chamber 2014 and alignment ridges 2020. FIG. 20 shows the following parts of the substrate carrier: upper part of heat choke 2010, gas flow divider 2011 (which separates the gas flow into the two flow paths through the substrate carrier—see FIG. 12A) and receiving channels 2012 which are designed to mate with the alignment ridges 2012. Note that the alignment ridges, and the receiving channels form a complete seal between the manifold and substrate carrier—this is apparent from the view of the alignment ridges 1620 in FIG. 16. The trapezoidal section of the alignment ridges and matching receiving channels enables mating of the manifold and substrate carrier with some tolerance for misalignment as the two parts are brought together—the sloped edges of the trapezoids guide the two parts into proper alignment. Note that the manifold and substrate carrier are engaged by moving the parts together in the directions shown by the arrows—either one or both parts may be moved; disengagement involves movement of the parts in the opposite directions. Further details of engagement of the substrate carrier and manifold are provided in U.S. Patent Application Publication No. US 2010/0263587 to Sivaramakrishnan et al. published on Oct. 21, 2010, incorporated herein by reference in its entirety. The trapezoidal section ridges and channels also accommodate the differences in thermal expansion of the materials of the mating parts, which may be quartz (manifold) and silicon carbide (heat choke). The ridges and channels are shown to have very similar dimensions in FIG. 20; however, more typically the channels may be 1.5 to 2 times wider than the ridges for ease of engagement of the parts, providing this allows for alignment within the alignment tolerance of the parts. Furthermore, the ridges and channels are not limited to having trapezoidal cross-sections—ridges and channels with other cross-sections can be used providing they have sloped edges. Yet furthermore, the ridges may be on the substrate carrier and the channels may be on the manifold. Furthermore, any number of matching ridges and channels may be used, as are needed to provide a seal and alignment.

To load a fully assembled substrate carrier into the epitaxial reactor the following general steps may be followed. The substrate carrier is transported by robot to the epitaxial reactor. One or both of the gas manifolds is moved up/down to provide room for moving the substrate carrier into place. The substrate carrier is moved into place between the gas manifolds in the reactor. The substrate carrier and gas manifolds are mated and sealed with the assistance of the alignment ridges and channels as described above—for example, the substrate carrier may be lowered onto the lower gas manifold and then the upper gas manifold may be lowered into position on top of the substrate carrier. The process is reversed for removing the substrate carrier from the reactor.

Cost Model Revisited

The reduction in manufacturing cost of silicon wafers that is expected to be achieved using the present invention will permit cost competitiveness of single crystal silicon solar cells for the foreseeable future. An embodiment of the silicon epitaxial reactor of the present invention is used to demonstrate the commercial advantages of the invention for silicon solar cell fabrication. A cost model is used which assumes a system with 10 mini-batch reactors, each with a capacity of 36 125×125 millimeters squared substrates. The system operates in a TCS depletion mode using heat lamps to control the substrate temperature and cross-flow deposition. Growth of 180 micron thick wafers is assumed at a rate of 3.5 microns per minute. The low thermal mass substrate carrier design allows for heat-up from room temperature and cool-down to approximately 500° C. of 25 minutes. (The susceptor is removed from the deposition chamber to a cool-down chamber when the temperature reaches 500-600° C.)

Using the above assumptions, the time for simultaneous deposition of 180 thick silicon at a rate of 3.5 μm per minute is 51.4 minutes and the overhead time for heating the batch of substrates from room temperature to approximately 1,150° C. and then cooling from deposition temperature to 500 to 600° C. before removing from the reactor is approximately 25 minutes, giving a total time for deposition, including overhead, of $$51.5+25=76.5 \text{ minutes}$$

This gives a throughput for the 10 mini-batch system, with 36 substrates, of:

$$36 \times 10 \times 60 / 76.5 = 282 \text{ wafers per hour}$$

Then, assuming an ASP capital depreciation cost for the deposition system of $3 million, depreciated over a 7 year period with 90% uptime and 90% utilization, of $$3.0 \times 10^6 / (282 \times 0.9 \times 0.9 \times 24 \times 350 \times 7) = \$0.22 \text{ per wafer}$$

The cost of TCS consumed, assuming $3/kg of TCS and 50% TCS utilization is $0.20 per wafer. The cost of other gases—mainly hydrogen—is roughly $0.10 per wafer. Furthermore, the cost of other consumables, such as lamps, susceptors and substrates, are estimated at $0.10 per wafer.

The cost of electrical power consumed in heating the substrates assuming that each of the two lamp units for each of the 10 mini-batch reactors have an average power rating of 110 kW is given by $$\text{total lamp on time} = 51 \text{ minutes (deposition)} + 15 \text{ minutes (heat-up)} = 66 \text{ minutes}$$

$$\text{total energy consumed for 36 wafers} = 110 \times 2 \times 66/60 = 242 \text{ kWh}$$

$$\text{cost/wafer at } 40/\text{kwh} = 242 \times 0.04/36 = \$0.26 \text{ per wafer}$$

Furthermore, the costs associated with the reusable single crystal silicon substrate include a cost for growth of the porous silicon separation layer of approximately $0.05 per wafer, and a silicon substrate reuse and reclaim cost, assuming a lifetime of 100 depositions, of $0.18 per wafer.

The total cost of the 180 μm thick epitaxial silicon wafer is the sum of the costs calculated above $$\$0.22 + \$0.20 + \$0.10 + \$0.10 + \$0.26 + \$0.05 + \$0.18 = \$1.11 \text{ per wafer}$$

Assuming a solar cell output of 2.65 W (for a 17% efficiency), the cost per Wp is approximately $0.40, which meets the target of "total cost of epitaxial deposition close to $0.70 per wafer" as described at the end of the Background Section.

Many of the assumptions here including the deposition rate and TCS utilization have been verified in a prototype reactor. The above cost numbers were calculated assuming mass production at the modest scale of 100 MW per year.

Furthermore, the present invention allows wafers of various thicknesses to be produced, including very thin wafers below 50 μm. Deposition of thin silicon wafers using the epitaxial reactor of the present invention has commercial benefits as described above for 180 μm wafers, and more so, since the efficiency of conventional wafer production drops due to a larger kerf loss as wafers become thinner.

In addition to the commercial advantages for all wafer thicknesses, a number of differentiated technical advantages will allow a sustained cost advantage. These include: (1) perfectly square wafers for higher module packing density; (2) high quality monocrystalline wafers—no dissolved oxygen as in Czochralski wafers; (3) wafers may be either p or n-type doped; and (4) built-in B-doped BSF (back side field) for high efficiency (higher $V_{oc}$ and lower recombination losses).

Details of Release Layer

Having described the epitaxial reactor and deposition methods of the present invention, further aspects of the process steps of silicon wafer fabrication according to the present invention are provided with reference again to FIG. 2. In process step (210) a silicon substrate with a (100) crystal plane surface is preferred, since this crystalline orientation is most compatible with formation of a release layer by anodization in a hydrofluoric acid solution. In preferred embodiments of step (220), the release layer is formed by anodization in a hydrofluoric acid electrolyte and the anodization is controlled to form a release layer with sublayers of different porosities. For example, a high porosity layer is formed below a low porosity layer on the surface of the silicon substrate—the high porosity layer providing ease of wafer release and the low porosity layer providing a good template for epitaxial growth. Further details of the formation of the release layer, including high throughput processing methods for multiple substrates, are provided in U.S. Patent Application Publication No. US 2009/0227063 to Ravi et al. published on Sep. 10, 2009, incorporated herein by reference in its entirety. Methods for separation of the silicon wafer from the substrate rely on the mechanical fragility of the high porosity sub-layer of the release layer relative to adjacent layers. Some examples of suitable methods for step (240) are provided in U.S. Patent Application Publication No. US 2009/0227063 to Ravi et al. published on Sep. 10, 2009, incorporated herein by reference in its entirety. After separation of the wafer from the substrate, the remnants of the separation layer may readily be removed by chemical and/or mechanical processing, using techniques well known to those skilled in the art. Note that, as described above, the anodization of the substrate surface, epitaxial deposition on top of the anodized surface and separation of wafers from the substrate may be carried out on both sides of substrates simultaneously, which may provide further improvements in throughput and reduced manufacturing costs.

The substrates are reusable, as shown in step 250—after releasing the deposited wafer, remnants of the release layer are removed and the process flow is followed again, starting at step 210. The number of times a substrate may be reused depends on many factors, including the initial substrate thickness. For example, if a porous silicon release layer is used then a 725 micron thick substrate can be reused 50 times or more before reaching a minimum usable thickness of 400 to 500 microns.

Some Characteristics Of Epitaxial Silicon Wafers According To The Present Invention The silicon epitaxial reactor and deposition methods of the present invention have been used to deposit silicon wafers of thicknesses between 5 and 250 microns with thickness uniformity measured at ±4 to 5% over a 2×2 array of 125×125 millimeters squared wafers, and it is expected that wafers of thickness between 1 and 300 microns can be fabricated with thickness uniformity better than ±10-15%. These results underline the success of operating in a TCS depletion mode combined with substrate temperature control, cross-flow, etc., as described above. Furthermore, it is expected that wafers of thickness up to 500 to 600 microns may be made using the present invention. Clearly, wafers below roughly 50 microns in thickness will require a handle or other support—for example see U.S. Patent Application Publication No. US 2009/0227063 to Ravi et al. published on Sep. 10, 2009, incorporated herein by reference in its entirety, for a discussion of handles for epitaxial silicon wafers. Note that if thickness uniformity is prioritized over cost of deposition, then it is expected that thickness uniformity of ±1 to 2% can be achieved using the epitaxial reactor of the present invention.

The silicon epitaxial reactor and deposition methods of the present invention have been used to deposit silicon wafers from a TCS precursor where the substrate temperature is in the range of 1,000 to 1,250° C., providing a deposition rate of 3.5 to 10 microns per minute. Furthermore, deposition within the range of 950 to 1,300° C. is expected to provide a single crystal silicon wafer.

The silicon epitaxial reactor and deposition methods of the present invention have been used to deposit silicon wafers with a TCS utilization of 60%, and it is expected that TCS utilization of 70% can be achieved with further reductions in the non-substrate surface area within the wafer carrier. Furthermore, TCS utilization in excess of 5 to 10% represents an improvement over the deposition processes used in the semiconductor industry, and a TCS utilization of 40% or better currently represents the point at which the process becomes cost competitive in the solar market. As indicated in FIG. 1, the reactor of the present invention can operate with a low Cl/H ratio—even as low as the knee in the curve of growth rate vs. Cl/H ratio. (As the Cl/H ratio decreases, the percentage of precursor gas consumed to deposit silicon on the substrates increases and the process becomes more efficient and less costly from the perspective of precursor consumption. Hence, there is a desire to operate the reactor with a low Cl/H ratio in order to reduce the cost of precursor consumed.) The epitaxial reactor of the present invention is able to operate with a low TCS to hydrogen ratio since the reactor design allows the deposition conditions to be tailored to compensate for deposition in the depletion mode where the growth rate of silicon may change significantly across a substrate in the direction of precursor gas flow.

Further Embodiments of the Present Invention

Although the present invention has been described with respect to tools and methods for the fabrication of epitaxial silicon wafers from TCS precursor gas, other precursor gases may be used including dichlorosilane, silane, silicon tetrachloride, etc.

Although the present invention has been described with respect to tools and methods for the fabrication of square silicon substrates for solar applications, the principles and concepts of the present invention are applicable to the fabrication of rectangular silicon substrates with a wide range of dimensions, round silicon substrates (with or without flats), etc. In principle, any shape wafer might be formed simply by providing a template silicon substrate of the desired shape. Alternatively, a large silicon substrate may be used and different shapes may be defined, using a laser scribing tool for example. The shapes are then removed using a suitable lift-off technique such as described in U.S. Patent Appl. Publ. No. 2009/0227063 to Ravi et al. published on Sep. 10, 2009, incorporated herein by reference in its entirety.

Although the present invention has been described with respect to tools and methods for the fabrication of monocrystalline and multicrystalline silicon solar cells, the principles and concepts of the present invention are applicable to the fabrication of crystalline silicon wafers for a wide variety of uses, including semiconductor devices not requiring high resolution lithography, certain MEMS (micro electro-mechanical systems) devices such as microfluidic devices, etc. Furthermore, the present invention may be adapted to provide epitaxial silicon of more uniform thickness—approximately ±1%, at the expense of lower TCS conversion, and will be capable of depositing epitaxial silicon on the next generation of silicon substrates in the semiconductor industry—450 mm wafers. However, to achieve this level of uniformity may require additional variations of the process including rotating substrates during deposition, or sloping the substrates at a small angle to the direction of flow, as discussed in U.S. Patent Application Publication No. US 2010/0263587 to Sivaramakrishnan et al. published on Oct. 21, 2010, incorporated herein by reference in its entirety.

Although the present invention has been described with respect to tools and methods for the fabrication of monocrystalline and multicrystalline silicon solar cells, the principles and concepts of the present invention are applicable to epitaxial deposition of a wide range of crystalline materials, including GaAs, GaN, Ge, Si-Ge, InGaAs, SiC, etc. Deposition of such a wide range of materials is made possible by the porous silicon separation layer on the surface of the silicon substrates, which accommodates a greater lattice mismatch than an unmodified crystalline silicon surface. Alternatively, other substrates may be used, such as germanium, on which it is expected a suitable porous separation layer can be formed using anodization—the separation layer must allow deposition of an epitaxial film.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. An epitaxial reactor, comprising:
susceptors, said susceptors being assembled in a substrate carrier, said substrate carrier being configured to hold a first plurality of substrates with deposition surfaces parallel and opposed on either side of a gas flow channel for exposing the opposed surfaces of said substrates to precursor gas;
first and second gas manifolds at opposite ends of said substrate carrier, said first and second gas manifolds being configured to flow precursor gas over the surfaces of said substrates, said flow being parallel to said substrate surfaces, said flow being linear between said first and second gas manifolds; and
first heaters configured to heat said substrate carrier to enable precursor gas dissociation on said substrate surfaces while flowing precursor gas through said channel;
wherein said susceptors comprise first slots in said susceptors for placing bottom edges of said substrates into and second slots for placing over the top edges of said substrates, said top and bottom edges being aligned in said substrate carrier perpendicular to the gas flow direction through said gas flow channel, portions of said first and second slots being cantilevered over the top and bottom edges of said substrate for shielding said top and bottom edges from the gas flow through said gas flow channel.

2. The reactor as in claim 1, wherein said substrate carrier includes heat reflectors peripheral to said substrates and running parallel to the direction of gas flow through said gas flow channel.

3. The reactor as claim 1, further comprising second heaters configured to heat said first and second gas manifolds.

4. The reactor as in claim 3, wherein said second heaters include linear heat lamps positioned on either side of said substrate carrier and adjacent to and aligned with said first and second gas manifolds.

5. The reactor as in claim 1, wherein each of said first and second gas manifolds include a separation plate for isolating gas inlets from gas exhausts.

6. The reactor as in claim 1, wherein each of said first and second gas manifolds include a gas diffuser plate for ensuring the uniformity of said precursor gas delivered into said gas flow channel.

7. The reactor as in claim 1, wherein said first and second gas manifolds include baffles for increasing the path length of precursor gas through said manifolds.

8. The reactor as in claim 1, wherein said substrate carrier includes thermal chokes at the interfaces with said first and second gas manifolds, said thermal chokes providing some thermal isolation between said first and second gas manifolds and said substrate carrier.

9. The reactor as in claim 1, wherein said substrate carrier includes an interior susceptor configured to hold a second plurality of substrates, said interior susceptor dividing said gas flow channel into two parallel gas flow channels, the surfaces of said second plurality of substrates being parallel to the surfaces of said first plurality of substrates.

10. The reactor as in claim 9, wherein said substrate carrier includes first and second gas distribution channels between said first and second gas manifolds and said susceptors for splitting said gas flow into said two gas flow channels.

11. The reactor as in claim 10, further comprising third heaters configured to heat said first and second gas distribution channels.

12. The reactor as in claim 11, wherein said third heaters include linear heat lamps positioned on either side of said substrate carrier and adjacent to and aligned with said first and second gas distribution channels.

13. The reactor as in claim 11, wherein said first and second gas distribution channels include channels decorated with features for enhancing heat transfer to said gas flowing through said channels.

14. The reactor as in claim 9, wherein said interior susceptor holds substrates on both sides of said interior susceptor, wherein each of said second plurality of substrates is exposed to only one of said two parallel gas flow channels.

15. The reactor as in claim 9, wherein each of said second plurality of silicon substrates have a first deposition surface exposed to a first of said parallel flow channels and a second deposition surface exposed to a second of said parallel flow channels.

16. An epitaxial reactor, comprising:
susceptors, said susceptors being assembled in a substrate carrier, said substrate carrier being configured to hold a first plurality of substrates with deposition surfaces parallel and opposed on either side of a gas flow channel for exposing the opposed surfaces of said substrates to precursor gas; and
first and second gas manifolds at opposite ends of said substrate carrier, said first and second gas manifolds being configured to flow precursor gas over the surfaces of said substrates, said flow being parallel to said substrate surfaces, said flow being linear between said first and second gas manifolds;
wherein said first and second manifolds are sealed to said substrate carrier, said first and second manifolds have continuous sealing ridges, said substrate carrier having corresponding continuous receiving channels and wherein said sealing ridges and receiving channels have sloped sides for providing alignment tolerance between said manifolds and said substrate carrier as said manifolds and substrate carrier are brought together.

17. An epitaxial reactor, comprising:
susceptors, said susceptors being assembled in a substrate carrier, said substrate carrier being configured to hold a first plurality of substrates with deposition surfaces parallel and opposed on either side of a gas flow channel for exposing the opposed surfaces of said substrates to precursor gas;

first and second gas manifolds at opposite ends of said substrate carrier, said first and second gas manifolds being configured to flow precursor gas over the surfaces of said substrates, said flow being parallel to said substrate surfaces, said flow being linear between said first and second gas manifolds; and heaters configured to heat said substrate carrier to enable precursor gas dissociation on said substrate surfaces while flowing precursor gas through said channel;

wherein said susceptors are configured with recesses under the edges of said substrates for reducing bridging of deposited material between said substrates and said susceptors.

\* \* \* \* \*